(12) United States Patent
Ooshima

(10) Patent No.: US 6,667,493 B2
(45) Date of Patent: Dec. 23, 2003

(54) THIN-FILM MAGNETIC ELEMENT CAPABLE OF EFFECTIVELY ORIENTING MAGNETIZATION DIRECTION OF MAGNETIC LAYER AND MANUFACTURING METHOD THEREOF

(75) Inventor: Masahiro Ooshima, Niigata-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 0 days.

(21) Appl. No.: 09/992,944

(22) Filed: Nov. 6, 2001

(65) Prior Publication Data
US 2002/0075722 A1 Jun. 20, 2002

(30) Foreign Application Priority Data
Nov. 9, 2000 (JP) ........................................ 2000-342318

(51) Int. Cl.[7] .............................................. H01L 31/036
(52) U.S. Cl. ........................... 257/49; 360/126; 428/209
(58) Field of Search ............................ 257/49; 360/126; 428/209

(56) References Cited

U.S. PATENT DOCUMENTS

| 4,652,499 A | * | 3/1987 | Howard | ....................... 428/541 |
| 5,434,826 A | * | 7/1995 | Ravipati et al. | ............ 367/140 |
| 5,608,593 A | * | 3/1997 | Kim et al. | ................... 360/113 |
| 5,608,693 A | * | 3/1997 | Richards | ...................... 360/113 |
| 5,616,218 A | * | 4/1997 | Alex | ......................... 204/192.5 |
| 5,874,886 A | | 2/1999 | Araki et al. | |
| 5,959,810 A | * | 9/1999 | Kakihara et al. | ............ 360/113 |
| 2001/0055185 A1 | * | 12/2001 | Ooshima et al. | ......... 30/324.12 |

FOREIGN PATENT DOCUMENTS

| JP | 10-255237 | * | 9/1998 |
| JP | 2000-57526 | * | 2/2000 |

* cited by examiner

Primary Examiner—Nathan J. Flynn
Assistant Examiner—Ahmed N. Sefer
(74) Attorney, Agent, or Firm—Brinks Hofer Gilson & Lione

(57) ABSTRACT

A thin-film magnetic element comprises a substrate and a magnetoresistive multilayer film provided on the substrate. The multilayer film includes at least one magnetic layer. Bias underlayers formed of a nonmagnetic material are comprised in the thin-film magnetic element, having sidewall portions formed along side surfaces of the multilayer film and base portions formed on the surface of the substrate in the track width direction. The thickness of the sidewall portions is larger than that of the base portions. Hard magnetic layers for orienting the magnetization direction of at least one magnetic layer are deposited on the bias underlayers at sides of the multilayer film.

14 Claims, 11 Drawing Sheets

FILM THICKNESS RATIO b/a

FILM-FORMING ANGLE (°)
(INCIDENT ANGLE OF
SPUTTERING PARTICLES)

THIN-FILM MAGNETIC ELEMENT CAPABLE OF EFFECTIVELY ORIENTING MAGNETIZATION DIRECTION OF MAGNETIC LAYER AND MANUFACTURING METHOD THEREOF

BACKGROUND OF THE INVENTION

1. Field of the Invention

The present invention relates to a thin-film magnetic element including hard magnetic layers for orienting the magnetization direction of at least one magnetic layer included in a multilayer film having magnetoresistance and a manufacturing method thereof. In particular, the present invention relates to a thin-film magnetic element capable of effectively orienting the magnetization direction of the magnetic layer and a manufacturing method thereof.

2. Description of the Related Art

FIG. 20 is a sectional view of a conventional thin-film magnetic element viewed from the air-bearing surface (ABS).

A spin-valve thin-film element formed such that an antiferromagnetic layer 2 provided on an underlayer 1 extends toward both sides in the X direction and that the center of the antiferromagnetic layer 2 protrudes by a height of d1. The protruding antiferromagnetic layer 2 is provided with a pinned magnetic layer 3, a nonmagnetic conductive layer 4, a free magnetic layer 5, and a protective layer 6, forming a multilayer film 7, which is a laminate including the underlayer 1 to the protective layer 6.

In the thin-film magnetic element shown in FIG. 20, the antiferromagnetic layer 2 is a platinum-manganese (Pt—Mn) alloy film.

The pinned magnetic layer 3 and the free magnetic layer 5 are formed of a nickel-iron (Ni—Fe) alloy, cobalt (Co), an iron-cobalt (Fe—Co) alloy, an Fe—Co—Ni alloy, or the like. The nonmagnetic conductive layer 4 is formed of a nonmagnetic conductive material having a low electrical resistance such as copper (Cu).

Bias underlayers 8 serving as a buffer layer and an oriented film is formed of chromium (Cr) or the like so as to extend on the antiferromagnetic layer 2 toward both sides in the X direction and along both side surfaces of the multilayer film 7. Providing the bias underlayers 8 allows a bias magnetic field generated from hard bias layers 9, which are hard magnetic layers and will be described below, to be increased.

The bias underlayers 8 are provided with the hard magnetic layers 9 formed of, for example, a Co—Pt alloy or a Co—Cr—Pt alloy thereon.

The hard bias layers 9 are magnetized in the X direction, or track width direction, in the drawing. The bias magnetic field from the hard bias layer 9 orients the magnetization of the free magnetic layer 5 in the X direction.

The hard magnetic layers 9 are provided with interlayers 10 formed of a nonmagnetic material such as tantalum (Ta) thereon. The interlayers 10 are provided with electrode layers 11 formed of chromium (Cr), gold (Au), tantalum (Ta), tungsten (W), or the like thereon.

As described above, the bias underlayers 8 are formed so as to extend on the antiferromagnetic layer 2 toward both sides in the X direction and along both side surfaces of the multilayer film 7, and thereby the bias magnetic field generated from the hard bias layers 9 is increased.

The hard bias layers 9, which are formed to orient the magnetization of the free magnetic layer 5, are required to generate a large bias magnetic field near the free magnetic layer. However, the conventional thin-film magnetic element is formed, as shown in FIG. 20, such that the bias underlayers 8 taper off on both sides of the multilayer film 7, thus being scarcely deposited on both sides of the free magnetic layer 5. Therefore it is difficult to increase the bias magnetic field generated from the hard bias layers 9, or the hard magnetic layers.

SUMMARY OF THE INVENTION

Accordingly, an object of the present invention is to provide a thin-film magnetic element capable of increasing a bias magnetic field generated from hard magnetic layers, having bias underlayers with a sufficient thickness at a free magnetic layer. The bias underlayers are formed so that sidewall portions thereof have a thickness larger than that of base portions thereof.

To this end, according to one aspect of the present invention, there is provided a thin-film magnetic element comprising a substrate and a magnetoresistive multilayer film including at least one magnetic layer, provided on the substrate. Bias underlayers formed of a nonmagnetic material are comprised, having sidewall portions formed along side surfaces of the multilayer film and base portions formed on the surface of the substrate in the track width direction. The thickness of the sidewall portions is larger than that of the base portions. Hard magnetic layers for orienting the magnetization direction of at least one magnetic layer are deposited on the bias underlayers at sides of the multilayer film.

Forming the sidewall portions with a thickness larger than that of the base portions can result in the substantially uniform thickness of the sidewall portions. The bias underlayers are formed with a sufficient thickness near at least one free magnetic layer. Thus, the coercive force and the remanence ratio of and the bias magnetic field from the hard magnetic layers can be increased, and therefore Barkhausen noise of the thin-film magnetic element can be decreased.

The bias underlayers may be formed of at least one nonmagnetic material selected from Cr, W, Mo, V, Nb, and Ta.

Preferably, the sidewall portions of the bias underlayers have a thickness in the range of 15 to 75 Å. If the thickness of the sidewall portions is less than 15 Å, the hard magnetic layers cannot sufficiently generate a bias magnetic field on the sidewall portions. If the thickness of the sidewall portions is more than 75 Å, the bias underlayers block the bias magnetic field generated from the hard magnetic layers, and consequently the orientation of magnetization of the free magnetic layer becomes difficult.

The base portions of the bias underlayers preferably have a thickness in the range of 15 to 50 Å, advantageously increasing the coercive force and the remanence ratio of the hard magnetic layers.

The bias underlayers preferably have a body-centered cubic crystal structure of which the {200} faces are oriented parallel to the interfaces between the base portions thereof and the hard magnetic layers. Further, the hard magnetic layers may have a hexagonal close-packed crystal structure of which the {100} faces are oriented parallel to the surface of the magnetic layer of which the magnetization direction is oriented by a bias magnetic field from the hard magnetic layers.

When the bias underlayers have a body-centered cubic structure, and the {200} faces of the structure are oriented parallel to the interfaces between the base portions and the hard magnetic layers, the hard magnetic layers have a hexagonal close-packed structure of which the {100} faces are oriented parallel to the interfaces between the base portions and the hard magnetic layers. When the {100} faces are oriented parallel to the interfaces between the base portions and the hard magnetic layers, the {100} faces can be oriented parallel to the surface of the free magnetic layer. Thus, the c axes of the crystal axes of the hard magnetic layers are oriented parallel to the surface of the free magnetic layer, so that the bias magnetic field is generated effectively. Also, the coercive force and the remanence ratio of the hard magnetic layers are increased. As a result, the Barkhausen noise of the thin-film magnetic element is lowered and the sensitivity of magnetic field detection is improved.

The multilayer film may comprise an antiferromagnetic layer, a pinned magnetic layer of which the magnetization direction is pinned by the antiferromagnetic layer, a nonmagnetic material layer, and a free magnetic layer of which the magnetization direction is changed by an external magnetic field. The hard magnetic layers are provided at both sides of the free magnetic layer in the track width direction, and thereby the magnetization of the free magnetic layer is oriented in the direction which intersects the magnetization direction of the pinned magnetic layer by magnetic coupling with the hard magnetic layers. Thus the magnetic element results in a so-called spin-valve thin-film magnetic element.

Preferably, at least at each side of the free magnetic layer in the track width direction, the sidewall portions have, a thickness larger than that of the base portions.

Pursuant to another aspect of the present invention, there is provided a method of manufacturing a thin-film magnetic element. The manufacturing method comprises:

(a) providing a magnetoresistive multilayer film on a substrate;

(b) providing a lift-off resist layer having incisions at the undersurface thereof on the multilayer film;

(c) removing the multilayer film at portions which are not covered with the lift-off resist layer;

(d) depositing bias underlayers on sides of the multilayer film and on the substrate at a predetermined angle with respect to the normal to the substrate, wherein sidewall portions of the bias underlayers deposited along the sides of the multilayer film have a thickness larger than that of base portions deposited on the surface of the substrate;

(e) depositing, on the bias underlayers, a hard magnetic layers for orienting the magnetization direction of at least one magnetic layer included in the multilayer film;

(f) providing electrode layers on the hard magnetic layers;

(g) removing the resist layer; and (h) magnetizing the hard magnetic layers in the track width direction.

In step (d), by forming the bias underlayers on the sides of the multilayer film and on the substrate at a predetermined angle with respect to the normal to the surface of the substrate, the sidewall portions formed can have a thickness larger than that of the base portions.

The sidewall portions with a thickness larger than that of the base portions can have a substantially uniform thickness, allowing the bias underlayers to have a sufficient thickness near at least one magnetic layer included in the multilayer film. Thus, the coercive force and the remanence ratio of and the bias magnetic field from the hard magnetic layers can be increased, and therefore Barkhausen noise of the thin-film magnetic element can be decreased.

Preferably, in step (c), the multilayer film is provided so that the angle between the surface of the substrate and each side of the multilayer film is in the range of 20 to 60°. The bias underlayers are deposited at a predetermined angle in the range of 30 to 60° in step (d). Thus, the sidewall portions can be formed with a thickness larger than that of the base portions.

In step (c), the multilayer film may be provided so that the angle between the surface of the substrate and each side of the multilayer film is in the range of 20 to 45°, and the bias underlayers are deposited at a predetermined angle in the range of 19 to 60° in step (d). The multilayer film may be provided so that the angle between the surface of the substrate and each side of the multilayer film is in the range of 20 to 30°, and the bias underlayers are deposited at a predetermined angle in the range of 15 and 60° in step (d).

Preferably, in step (d), the bias underlayers are deposited by sputtering selected from among ion-beam sputtering, long-throw sputtering, and collimation sputtering.

Preferably, in step (e), the hard magnetic layers are deposited by sputtering selected from ion-beam sputtering, long-throw sputtering, and collimation sputtering.

The bias underlayers may be formed of at least one nonmagnetic material selected from Cr, W, Mo, V, Mn, Nb, and Ta.

Preferably, in step (d), the sidewall portions are deposited with a thickness in the range of 15 to 75 Å. Also, the base portions are deposited with a thickness in the range of 15 to 50 Å.

The bias underlayers may be deposited at a predetermined angle of 50° or more in step (d) so as to have a body-centered cubic crystal structure of which the {200} faces are oriented parallel to the interfaces between the base portions thereof and the hard magnetic layers.

When the bias underlayers have a body-centered cubic structure, and the {200} faces of the structure thereof are oriented parallel to the interfaces between the base portions and the hard magnetic layers, the hard magnetic layers may be deposited in step (e) so as to have a hexagonal close-packed crystal structure of which the {100} faces are oriented parallel to the surface of the magnetic layer of which the magnetization direction is oriented by a bias magnetic field from the hard magnetic layers.

The multilayer film may be formed in step (a) so as to comprise an antiferromagnetic layer, a pinned magnetic layer of which the magnetization direction is pinned by the antiferromagnetic layer, a nonmagnetic material layer, and a free magnetic layer of which the magnetization direction is changed by an external magnetic field. The hard magnetic layers are provided at both sides of the free magnetic layer in the track width direction, and thereby the magnetization of the free magnetic layer is oriented in the direction which intersects the magnetization direction of the pinned magnetic layer by magnetic coupling with the hard magnetic layers. Thus the magnetic element results in a so-called spin-valve thin-film magnetic element.

In step (d), at least at both sides of the free magnetic layer in the track width direction, the sidewall portions preferably have a thickness larger than that of the base portions.

According to the present invention, forming the bias underlayers such that the sidewall portions thereof have a thickness larger than that of the base portions thereof and forming the hard magnetic layers on the bias underlayers allow the sidewall portions have an uniform thickness. Also, the bias underlayers can have sufficient thickness near at least one magnetic layer included in the multilayer film.

Thus, the coercive force and the remanence ratio of and the bias magnetic field from the hard magnetic layers can be

DESCRIPTION OF THE PREFERRED EMBODIMENTS

Figure 1:
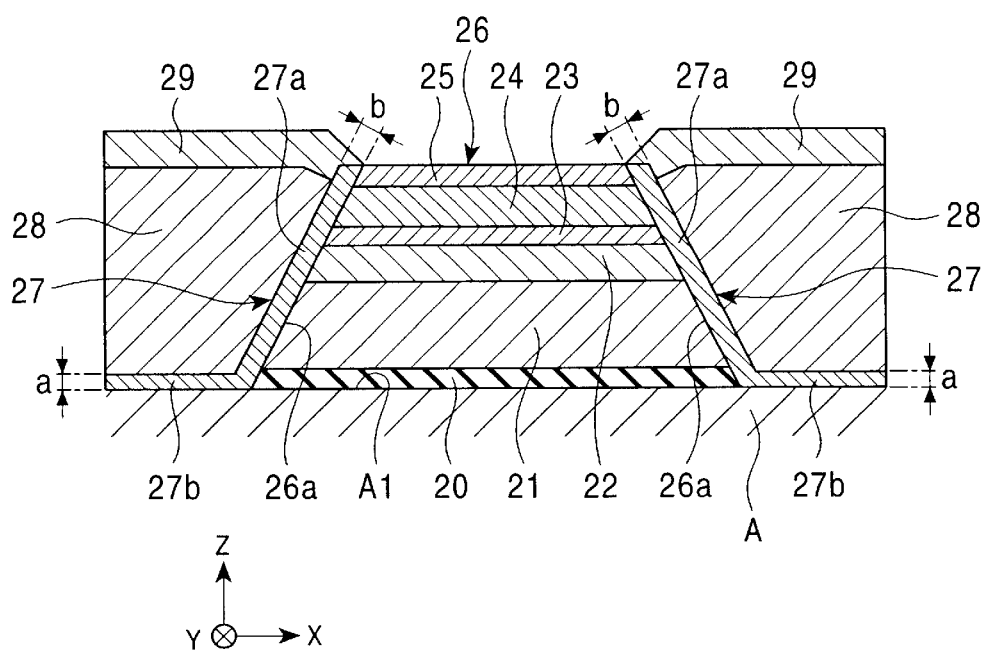
FIG. 1 is a sectional view of a thin-film magnetic element viewed from the air-bearing surface (ABS) according to a first embodiment of the present invention.

FIG. 1 is a sectional view of a thin-film magnetic element viewed from the ABS according to a first embodiment of the present invention.

This thin-film magnetic element is called a spin-valve thin-film element, which is a giant magnetoresistive (GMR) element based on giant magnetoresistive effects. The spin-valve thin-film element is provided at a trailing end of a floating slider in a hard disk drive or the like to detect a recording magnetic field from the hard disk. A magnetic storage medium such as a hard disk moves in the X direction and a leakage magnetic field from the magnetic storage medium is oriented in the Y direction.

As shown in FIG. 1, a substrate A is provided with an underlayer 20 formed of a nonmagnetic material such as tantalum (Ta) thereon. On the underlayer 20, an antiferromagnetic layer 21, a pinned magnetic layer 22, a nonmagnetic conductive layer 23, and a free magnetic layer 24 are deposited in that order. The free magnetic layer 24 is provided with a protective layer 25 formed of Ta or the like thereon. The layers from the underlayer 20 to the protective layer 25 form a multilayer film 26.

The pinned magnetic layer 22 is in contact with the antiferromagnetic layer 21. Thus, exchange anisotropic magnetic field based on magnetic coupling is generated at the interface between the antiferromagnetic layer 21 and the pinned magnetic layer 22 by annealing in a magnetic field, and thereby the magnetization of the pinned magnetic layer 22 is pinned in the Y direction shown in the drawing.

The antiferromagnetic layer 21 is formed of a platinum-manganese (Pt—Mn) alloy film. The Pt—Mn alloy has excellent properties for antiferromagnetic materials, exhibiting higher corrosion resistance than conventional antiferromagnetic layer materials such as iron-manganese (Fe—Mn) and nickel-manganese (Ni—Mn) alloys, a high blocking temperature, and a large exchange anisotropic magnetic field (Hex).

Alternatively, the antiferromagnetic layer 21 may be formed of an X—Mn or a Pt—Mn—X' alloy, wherein X is at least one element selected from palladium (Pd), iridium (Ir), rhodium (Rh), and ruthenium (Ru) and X' is at least one element selected from Pd, Ir, Rh, Ru, Au, and Ag.

The pinned magnetic layer 22 and the free magnetic layer 24 are formed of a Ni—Fe alloy, elemental Co, an Fe—Co alloy, an Fe—Co—Ni alloy, or the like. The nonmagnetic conductive layer 23 is formed of a nonmagnetic conductive material having a low electrical resistance such as Copper (Cu).

Both sides of the multilayer film 26 in the track width direction (the X direction) are provided with bias underlayers 27. The bias underlayers 27 are provided with hard magnetic layers 28 formed of a Co—Pt alloy thereon.

The hard magnetic layers 28 are magnetized in the X direction (the track width direction), and the bias magnetic field from the hard magnetic layers 28 orients the magnetization of the free magnetic layer 24 in the X direction.

The hard magnetic layers 28 are provided with electrode layers 29 formed of Cr, Au, Ta, W, or the like thereon. Interlayers may be formed of a nonmagnetic material such as Ta between the hard magnetic layers 28 and the electrode layers 29.

Each bias underlayer 27 has a sidewall portion 27a formed along a side surface 26a of the multilayer film 26 and a base portion 27b underlying a hard magnetic layer 28 substantially parallel to the surface of the substrate A in the track width direction (the X direction).

In this embodiment, the thickness b of the sidewall portion 27a is larger than the thickness a of the base portion 27b, that is, b/a>1.

Forming the sidewall portion 27a with a thickness b, which is larger than a, can result in the substantially uniform thickness of the sidewall portion 27a. Thus, the bias underlayers 27 can have a sufficient thickness near the free magnetic layer 24, which is oriented in the track width direction by a bias magnetic field from the hard magnetic layers 28. Thus, the coercive force and the remanence ratio of and the bias magnetic field from the hard magnetic layers 28 can be increased, and therefore Barkhausen noise of the thin-film magnetic element can be decreased.

The bias underlayers 27 are formed of Cr in this embodiment. Alternatively, the bias underlayers 27 may be formed of at least one nonmagnetic material selected from Cr, W, molybdenum (Mo), vanadium (V), Mn, niobium (Nb), and Ta.

The thickness b of the sidewall portions 27a of the bias underlayers 27 is in the range of 15 to 75 Å. If the thickness b is less than 15 Å, the crystal orientation of the bias underlayers 27 is disordered near the surface thereof, and thus the hard magnetic layers 28 cannot have a proper crystal orientation on the sidewall portions 27a of the bias underlayers 27. As a result, the hard magnetic layers 28 cannot sufficiently generate a bias magnetic field on the sidewall portions 27a. If the thickness b of the sidewall portions 27a is more than 75 Å, the bias underlayers 27 block the bias magnetic field generated from the hard magnetic layers 28, and consequently the magnetization of the free magnetic layer is barely oriented.

In this embodiment, the base portions 27b of the bias underlayers 27 have a thickness a in the range of 15 to 50 Å, thus increasing the coercive force and the remanence ratio of the hard magnetic layers 28.

The bias underlayers 27 have a body-centered cubic structure, and the {200} faces of the structure are oriented parallel to the interfaces between the base portions 27b and the hard magnetic layers 28 (in the X direction). The hard magnetic layers 28 have a hexagonal close-packed structure, and the {100} faces of the structure are oriented parallel to the surface of the free magnetic layer 24 (in the X direction).

When the bias underlayers 27 have a body-centered cubic structure, and the {200} faces of the structure are oriented parallel to the interfaces between the base portions 27b and the hard magnetic layers 28, the hard magnetic layers 28 deposited on the bias underlayers 27 have a hexagonal close-packed structure such that the {100} faces are oriented parallel to the interface between the base portions 27b and the hard magnetic layers 28.

When the {100} faces of the hard magnetic layers 28 are oriented parallel to the interfaces between the base portions 27b and the hard magnetic layers 28, the {100} faces can be oriented parallel to the surface of the free magnetic layer 24. Thus, the c axes of the crystal axes of the hard magnetic layers 28 are oriented parallel to the surface of the free magnetic layer 24, so that the bias magnetic field is generated effectively. Also, the coercive force and the remanence ratio of the hard magnetic layers 28 are increased. As a result, the Barkhausen noise of the thin-film magnetic element is reduced and the sensitivity of magnetic field detection is improved.

Figure 2:
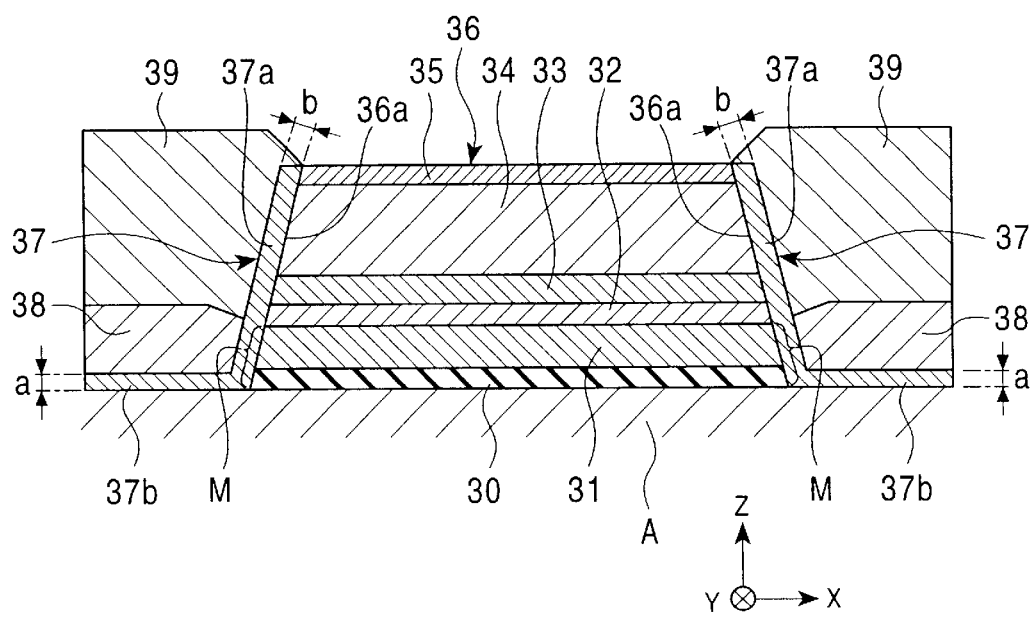
FIG. 2 is a sectional view of a thin-film magnetic element viewed from the ABS according to a second embodiment of the present invention.

FIG. 2 is a sectional view of a thin-film magnetic element viewed from the ABS according to a second embodiment of the present invention.

A multilayer film 36 of a spin-valve thin-film element shown in FIG. 2 is formed by depositing, on a substrate A, an underlayer 30, a free magnetic layer 31, a nonmagnetic conductive layer 32, a pinned magnetic layer 33, an antiferromagnetic layer 34, and a protective layer 35 in that order. This depositing order is reverse to that of the multilayer film 26 of the spin-valve thin-film element shown in FIG. 1. Materials for the underlayer 30, the free magnetic layer 31, the nonmagnetic conductive layer 32, the pinned magnetic layer 33, the antiferromagnetic layer 34, and the protective layer 35 are the same as the materials for the underlayer 20, the free magnetic layer 24, the nonmagnetic conductive layer 23, the pinned magnetic layer 22, the antiferromagnetic layer 21, and the protective layer 25 of the thin-film magnetic element shown in FIG. 1 respectively.

Each face M shown in FIG. 2 represents a magnetically coupled face between the multilayer film 36 and a hard magnetic layer 38. The vertical level of the upper border of the face M in a medium running direction, or the Z direction, is equal to the vertical level of the face of the free magnetic layer 31 in the medium running direction.

The hard magnetic layers 38 are magnetically coupled only with the free magnetic layer 31. Since the hard magnetic layers 38 shown in FIG. 2 are not magnetically coupled with the pinned magnetic layer 33, a bias magnetic field generated from the hard magnetic layers 38 is restrained from acting on the magnetization direction of the pinned magnetic layer 33.

On both sides of the multilayer film 36 in the track width direction (the X direction), bias underlayers 37 are formed of Cr. Alternatively, the bias underlayers 37 are formed of at least one nonmagnetic material selected from Cr, W, Mo, V, Mn, Nb, and Ta. The bias underlayers 37 are provided with the hard magnetic layers 38 formed of a Co—Pt alloy thereon.

The hard magnetic layers 38 are magnetized in the X direction (the track width direction), and the bias magnetic field from the hard magnetic layers 38 orients the free magnetic layer 31 in the X direction.

The hard magnetic layers 38 are provided with electrode layers 29 formed of Cr, Au, Ta, W, or the like thereon. Interlayers may be formed of a nonmagnetic material such as Ta between the hard magnetic layers 38 and the electrode layers 39.

Each bias underlayer 37 has a sidewall portion 37a formed along a side surface 36a of the multilayer film 36 and a base portion 37b underlying a hard magnetic layer 38 substantially parallel to the surface of the substrate A in the track width direction (the X direction).

In this embodiment, the thickness b of the sidewall portion 37a is larger than the thickness a of the base portion 37b, that is, b/a>1.

Forming the sidewall portion 37a with a thickness b, which is larger than a, can result in the substantially uniform thickness of the sidewall portion 37a. Thus, bias underlayers 37 can have a sufficient thickness near the free magnetic layer 31, which is oriented in the track width direction by a bias magnetic field from the hard magnetic layers 38. Thus, the coercive force and the remanence ratio of the hard magnetic layers 38 can be increased, and therefore Barkhausen noise of the thin-film magnetic element can be decreased.

The bias underlayers 37 are formed of Cr.

The thickness b of the sidewall portions 37a of the bias underlayers 37 is in the range of 15 to 75 Å. If the thickness b is less than 15 Å, the crystal orientation of the bias underlayers 37 is disordered near the surface thereof, and thus the hard magnetic layers 38 cannot have a proper crystal orientation on the sidewall portions 37a of the bias underlayers 37. As a result, the hard magnetic layers 38 cannot sufficiently generate a bias magnetic field on the sidewall portion 37a. If the thickness b of the sidewall portions 37a is more than 75 Å, the bias underlayers 37 block the bias magnetic field generated from the hard magnetic layers 38, and consequently the magnetization of the free magnetic layer is barely oriented.

In this embodiment, the base portions 37b of the bias underlayers 37 have a thickness a in the range of 15 to 50 Å, thus increasing the coercive force and the remanence ratio of the hard magnetic layers 38.

The bias underlayers 37 have a body-centered cubic structure, and the {200} faces of the structure are oriented parallel to the interfaces between the base portions 37b and the hard magnetic layers 38 (in the X direction). The hard magnetic layers 38 have a hexagonal close-packed structure, and the {100} faces of the structure are oriented parallel to the surface of the free magnetic layer 31 (in the X direction).

Hence, the c axes of the crystal axes of the hard magnetic layers 38 are oriented parallel to the surface of the free magnetic layer 31, so that the bias magnetic field is generated effectively. Also, the coercive force and the remanence ratio of the hard magnetic layers 38 are increased. As a result, the Barkhausen noise of the thin-film magnetic element is lowered and the sensitivity of magnetic field detection is improved.

Figure 3:
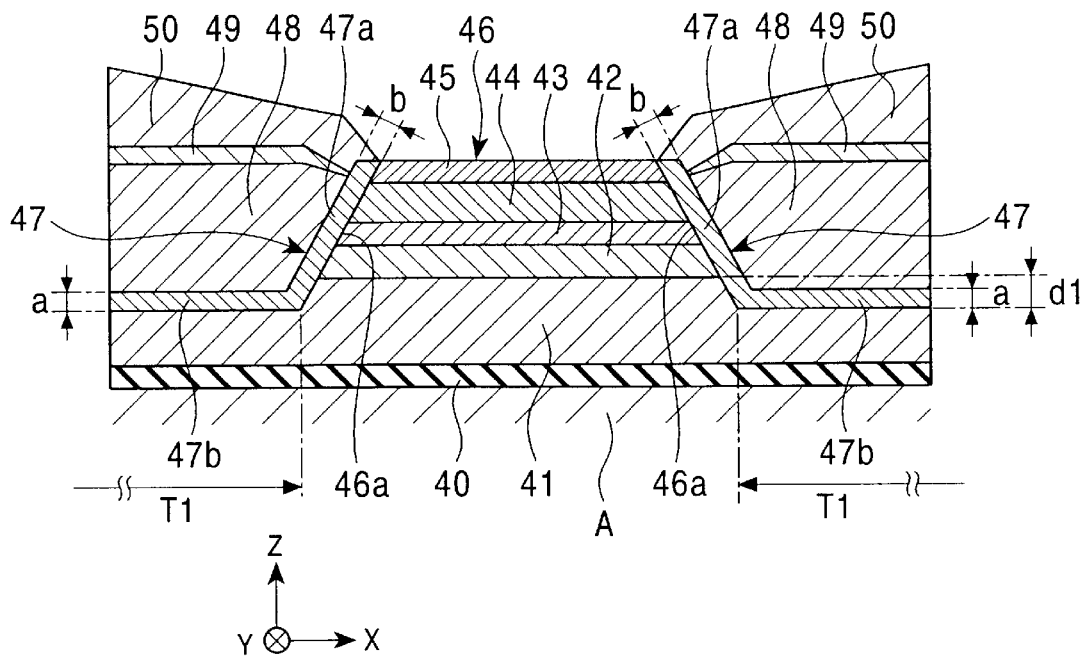
FIG. 3 is a sectional view of a thin-film magnetic element viewed from the ABS according to a third embodiment of the present invention.

FIG. 3 is a sectional view of a thin-film magnetic element viewed from the ABS according to a third embodiment of the present invention.

In the spin-valve thin-film element shown in FIG. 3, an underlayer 40 is formed on the substrate A. An antiferromagnetic layer 41 provided on the underlayer 40 extends toward both sides in the X direction and protrudes by a height d1 in the center thereof. A pinned magnetic layer 42, a nonmagnetic conductive layer 43, a free magnetic layer 44, and a protective layer 45 are formed on the protruding antiferromagnetic layer 42. The layers from the underlayer 40 to the protective layer 45 constitute a multilayer film 46.

The antiferromagnetic layer 41 is formed of a Pt—Mn alloy film. Alternatively, the antiferromagnetic layer 41 may be formed of an X—Mn or a Pt—Mn—X' alloy, wherein X is at least one elements selected from Pd, Ir, Rh, and Ru and X' is at least one element selected from Pd, Ir, Rh, Ru, Au, and Ag.

The pinned magnetic layer 42 and the free magnetic layer 44 are formed of a Ni—Fe alloy, elemental Co, an Fe—Co alloy, an Fe—Co—Ni alloy, or the like. The nonmagnetic conductive layer 43 is formed of a nonmagnetic conductive material having a low electrical resistance such as Cu.

Further, bias underlayers 47 formed of Cr are provided on both surfaces having a width T1 of the antiferromagnetic layer 41 and on both sides of the multilayer film 46 upwards, as shown FIG. 3. Alternatively, the bias underlayers 47 are formed of at least one nonmagnetic material selected from Cr, W, Mo, V, Mn, Nb, and Ta. The bias underlayers 47 are provided with the hard magnetic layers 48 formed of a Co—Pt alloy thereon.

The hard magnetic layers 48 are magnetized in the X direction (the track width direction), and the bias magnetic field from the hard magnetic layers 48 orients the free magnetic layer 44 in the X direction.

Further, interlayers 49 are formed of a nonmagnetic material such as Ta on the hard magnetic layers 28, and electrode layers 50 are formed of Cr, Au, Ta, W, or the like on the interlayers 49.

Since the antiferromagnetic layer 41 shown in FIG. 3 underlies the hard magnetic layers 48, the thickness of the hard magnetic layers 48 can be reduced. The hard magnetic layers 48 therefore can be readily formed by sputtering.

Each bias underlayer 47 has a sidewall portion 47a formed along a side surface 46a of the multilayer film 46 and a base portion 47b underlying a hard magnetic layer 48 substantially parallel to the surface of the substrate A in the track width direction (the X direction).

In this embodiment also, the thickness b of the sidewall portion 47a is larger than the thickness a of the base portion 47b, that is, b/a>1.

Forming the sidewall portion 47a with a thickness b, which is larger than a, can result in the substantially uniform thickness of the sidewall portion 47a. Thus, the bias underlayers 47 can have a sufficient thickness near the free magnetic layer 44, which is oriented in the track width direction by a bias magnetic field from the hard magnetic layers 48. Thus, the coercive force and the remanence ratio of the hard magnetic layers 48 can be increased, and therefore Barkhausen noise of the thin-film magnetic element can be decreased.

The bias underlayers 47 are formed of Cr in this embodiment.

The thickness b of the sidewall portions 47a of the bias underlayers 47 is in the range of 15 to 75 Å. If the thickness b is less than 15 Å, the crystal orientation of the bias underlayers 47 is disordered near the surface thereof, and thus the hard magnetic layers 48 cannot have a proper crystal orientation on the sidewall portions 47a of the bias underlayers 47. As a result, the hard magnetic layers 48 cannot sufficiently generate a bias magnetic field on the sidewall portion 47a. If the thickness b of the sidewall portions 47a is more than 75 Å, the bias underlayers 47 block the bias magnetic field generated from the hard magnetic layers 48, and consequently the magnetization of the free magnetic layer is barely oriented.

In this embodiment, the base portions 47b of the bias underlayers 47 have a thickness a in the range of 15 to 50 Å, thus increasing the coercive force and the remanence ratio of the hard magnetic layers 48.

The bias underlayers 47 have a body-centered cubic structure, and the {200} faces of the structure are oriented parallel to the interfaces between the base portions 47b and the hard magnetic layers 48 (in the X direction). The hard magnetic layers 48 have a hexagonal close-packed structure, and the {100} faces of the structure are oriented parallel to the surface of the free magnetic layer 44 (in the X direction).

Hence, the c axes of the crystal axes of the hard magnetic layers 48 are oriented parallel to the surface of the free magnetic layer 44, so that the bias magnetic field is generated effectively. Also, the coercive force and the remanence ratio of the hard magnetic layers 48 are increased. As a result, the Barkhausen noise of the thin-film magnetic element is lowered and the sensitivity of magnetic field detection is improved.

The thin-film magnetic elements shown in FIGS. 1 to 3, the sidewall portions 27a, 37a, 47a of the bias underlayers 27, 37, and 47 have each a uniform thickness on both sides of the multilayer films 26, 36, and 46, respectively. I the present invention, however, the sidewall portion may have a nonuniform thickness.

Figure 4:
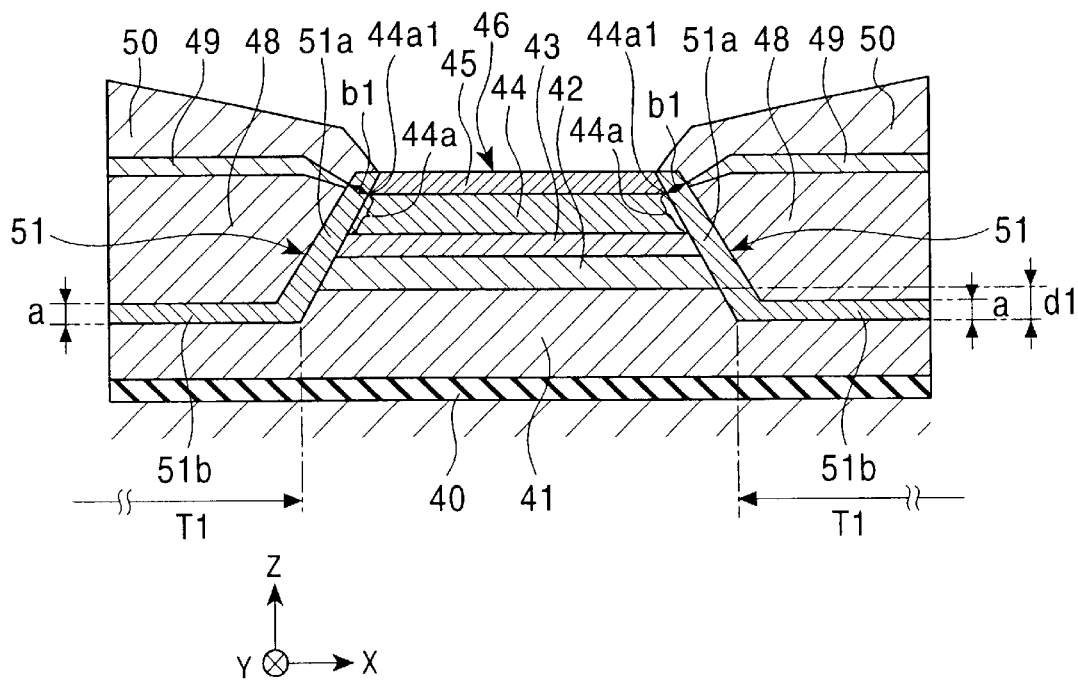
FIG. 4 is a sectional view of a thin-film magnetic element viewed from the ABS according to a fourth embodiment of the present invention.

FIG. 4 is a sectional view of a thin-film magnetic element viewed from the ABS according to a fourth embodiment of the present invention.

The thin-film magnetic element in FIG. 4 has substantially the same structure as the thin-film magnetic element shown in FIG. 3, except that the sidewall portions 51a of the bias underlayers 51 become gradually thinner toward the top.

In FIG. 4, each sidewall portion 51a becomes gradually thinner toward the top, and a thickness b1 thereof at the top of each side 44a of the free magnetic layer 44 in the track width direction is larger than a thickness a of each base portion 51b. Any thickness along the sidewall portion 51a at each side 44a of the free magnetic layer 44 in the track width direction is therefore larger than the thickness a of the base portion 51b.

Forming the sidewall portions 51a with a thickness b1, which is larger than a, on both sides 44a of the free magnetic layer 44 can result in the bias underlayers 51 having sufficient thickness near the free magnetic layer 44. Thus, the coercive force and the remanence ratio of and the bias magnetic field from the hard magnetic layers 48 can be increased, and therefore Barkhausen noise of the thin-film magnetic element can be decreased.

The bias underlayers 51 are formed of Cr in this embodiment. The bias underlayers 51 may be formed of at least one nonmagnetic material selected from Cr, W, Mo, V, Mn, Nb, and Ta.

The thickness b1 of the sidewall portions 51a of the bias underlayers 51 on the tops 44a1 of both sides 44a of the free magnetic layer 44 is in the range of 15 to 75 Å. If the thickness b1 is less than 15 Å, the crystal orientation of the bias underlayers 51 is disordered near the surface thereof, and thus the hard magnetic layers 48 cannot have a proper crystal orientation on the sidewall portions 51a of the bias underlayers 51. As a result, the hard magnetic layers 48 cannot sufficiently generate a bias magnetic field on the sidewall portion 51a.

Any thickness along the sidewall portions 51a is preferably 75 Å or less. If the thickness is more than 75 Å, the bias underlayers 51 block the bias magnetic field generated from the hard magnetic layers 48, and consequently the magnetization of the free magnetic layer 44 is barely oriented.

In this embodiment, the base portions 51b of the bias underlayers 51 have a thickness a in the range of 15 to 50 Å, thus increasing the coercive force and the remanence ratio of the hard magnetic layers 48.

The bias underlayers 51 have a body-centered cubic structure, and the {200} faces of the structure are oriented parallel to the interfaces between the base portions 51b and the hard magnetic layers 48 (in the X direction). The hard magnetic layers 48 have a hexagonal close-packed structure, and the {100} faces of the structure are oriented parallel to the surface of the free magnetic layer 44 (in the X direction).

That is, the c axes of the crystal axes of the hard magnetic layers 48 are oriented parallel to the surface of the free magnetic layer 44, so that the bias magnetic field is generated effectively. Also, the coercive force of the hard magnetic layers 48 is increased. As a result, the Barkhausen noise of the thin-film magnetic element is lowered and the sensitivity of magnetic field detection is improved.

Figure 5:
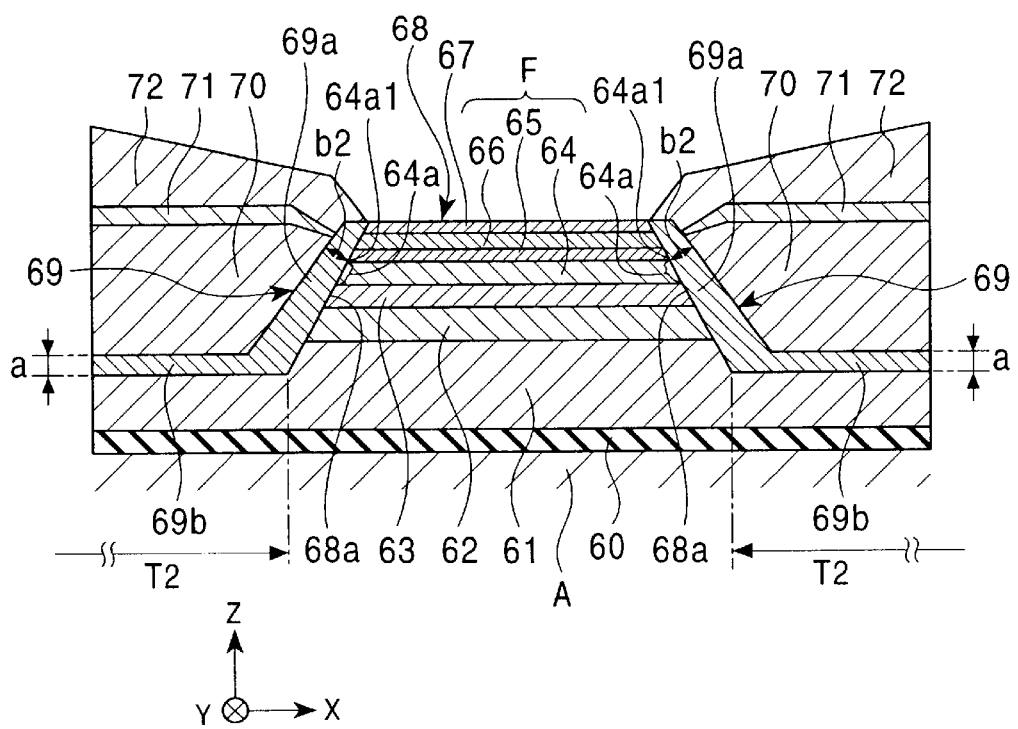
FIG. 5 is a sectional view of a thin-film magnetic element viewed from the ABS according to a fifth embodiment of the present invention.

FIG. 5 is a sectional view of the thin-film magnetic element viewed from the ABS according to a fifth embodiment of the present invention.

In the spin-valve thin-film element shown in FIG. 5, an underlayer 60 is formed on the substrate A. An antiferromagnetic layer 61 provided on the underlayer 60 extends toward both sides in the X direction and protrudes in the center thereof. The protruding antiferromagnetic layer 61 is provided with a pinned magnetic layer 62, a nonmagnetic conductive layer 63, a first free magnetic layer 64, a nonmagnetic material layer 65, a second free magnetic layer 66, and a protective layer 45, forming a multilayer film 68, which is a laminate including the underlayer 60 to the protective layer 67.

The pinned magnetic layer 62 is in contact with the antiferromagnetic layer 61. Thus, an exchange anisotropic magnetic field based on magnetic coupling is generated at the interface between the antiferromagnetic layer 61 and the pinned magnetic layer 62 by annealing in a magnetic field, and thereby the magnetization of the pinned magnetic layer 62 is pinned in the Y direction shown in the drawing.

The antiferromagnetic layer 61 is formed of a platinum-manganese (Pt—Mn) alloy film. Alternatively, the antiferromagnetic layer 61 is formed of an X—Mn or a Pt—Mn—X' alloy, wherein X is at least one element selected from Pd, Ir, Rh, and Ru and X' is at least one element selected from Pd, Ir, Rh, Ru, Au, and Ag.

The pinned magnetic layer 62, the first free magnetic layer 64, and the second free magnetic layer 66 are formed of a Ni—Fe alloy, elemental Co, an Fe—Co alloy, an Fe—Co—Ni alloy, or the like.

The nonmagnetic conductive layer 63 is formed of a nonmagnetic conductive material having a low electrical resistance such as Copper (Cu).

Further, bias underlayers 69 formed of Cr are provided on both surfaces of the antiferromagnetic layer 61, which have a width T2, and on both sides of the multilayer film 68 upwards, as shown FIG. 5. Alternatively, the bias underlayers 69 may be formed of at least one nonmagnetic material selected from Cr, W, Mo, V, Mn, Nb, and Ta.

The bias underlayers 69 are provided with hard magnetic layers 70 formed of a Co—Pt alloy thereon.

Interlayers 71 are formed of a nonmagnetic material such as Ta on the hard magnetic layers 70, and electrode layers 72 are formed of Cr, Au, Ta, W, or the like on the interlayers 71.

Since the antiferromagnetic layer 61 shown in FIG. 5 underlies the hard magnetic layers 70, the thickness of the hard magnetic layers 70 can be reduced. The hard magnetic layers 70 therefore can be readily formed by sputtering.

The first free magnetic layer 64 and the second free magnetic layer 66 have mutually different magnetic moments. A magnetic moment is represented by the product of a saturated magnetization (Ms) and a thickness (t). Hence, the first free magnetic layer 64 and the second free magnetic layer 66 can have mutually different magnetic moments by forming free magnetic layers having different thicknesses with the same material.

The nonmagnetic material layer 65 between the first and the second free magnetic layers 64 and 66 is formed of at least one metal selected from Ru, Rh, Ir, Cr, rhenium (Re), and Cu.

The first and the second free magnetic layers 64 and 66, which have different magnetic moments and are separated by the nonmagnetic material layer 65, functions as one free magnetic layer F.

The first and the second free magnetic layers 64 and 66 are in a ferrimagnetic state, in which the magnetization directions thereof are different by 180° from each other. The magnetization of a free magnetic layer having a larger magnetic moment, for example, the first free magnetic layer 64, is oriented in a direction of the magnetic field generated from the hard magnetic layers 70, and the other magnetization, for example, that of the second free magnetic layer 66 is oriented in a direction different by 180°.

The ferrimagnetism of the first and the second free magnetic layers 64 and 66 brings about the same effect as that by decreasing the thickness of the free magnetic layer F, that is, reduced saturated magnetization and a facilitated change in magnetization of the free magnetic layer F. Thus the magnetic filed detection sensitivity of the magnetoresistive element is improved.

The magnetization of the free magnetic layer F is oriented in the direction of the synthetic magnetic moment which is the sum of the first and the second free magnetic layers 64 and 66.

However, only the magnetization of the first free magnetic layer 64 contributes to the output because of the relationship to the magnetization direction of the pinned magnetic layer 62.

The hard magnetic layers 70 are magnetized in the X direction (the track width direction), and the bias magnetic field from the hard magnetic layers 70 orients the free magnetic layer F in the X direction.

In order to orient the free magnetic layer F in the X direction, the bias magnetic filed from the hard magnetic layers 70 may be applied only to the first free magnetic layer 64.

Each bias underlayer 69 has a sidewall portion 69a formed along a side surface 68a of the multilayer film 68 and a base portion 69b underlying a hard magnetic layer 70 substantially parallel to the surface of the substrate A in the track width direction (the X direction).

In this embodiment, the sidewall portions 69a of bias underlayers 69 are formed so as to gradually slenderize upwards.

In FIG. 5, each sidewall portion 69a becomes gradually thinner toward the top, and a thickness b2 thereof at the top of each side 64a1 of the first free magnetic layer 64 in the track width direction is larger than a thickness a of each base portion 69b. Thus, any thickness along the sidewall portion 69a at each side 64a of the first free magnetic layer 64 in the track width direction is larger than the thickness a of the base portion 69b.

Forming the sidewall portions 69a with a thickness b2, which is larger than a, on both sides 64a of the first free magnetic layer 64 can result in the bias underlayers 69 having sufficient thickness near the first free magnetic layer 64. Thus, the coercive force and the remanence ratio of the hard magnetic layers 70 and a bias magnetic field can be increased, and therefore Barkhausen noise of the thin-film magnetic element can be decreased.

The bias underlayers 69 are formed of Cr in this embodiment.

The thickness b2 of the sidewall portions 69a of the bias underlayers 69 on the tops 64a1 of both sides 64a of the first free magnetic layer 64 is 15 Å or more. If the thickness b2 is less than 15 Å, the crystal orientation of the bias underlayers 69 is disordered near the surface thereof, and thus the hard magnetic layers 70 cannot have a proper crystal orientation on the sidewall portions 69a of the bias underlayers 69. As a result, the hard magnetic layers 70 cannot sufficiently generate a bias magnetic field on the sidewall portion 69a. The thickness is preferably 75 Å or less over the entire sidewall portions 69a. If the thickness is more than 75 Å, the bias underlayers 69 block the bias magnetic field generated from the hard magnetic layers 70, and consequently the magnetization of the first free magnetic layer 64 is barely oriented.

In this embodiment, the base portions 69b of the bias underlayers 69 have a thickness a in the range of 15 to 50 Å, thus increasing the coercive force and the remanence ratio of the hard magnetic layers 70.

The bias underlayers 69 have a body-centered cubic structure, and the {200} faces of the structure are oriented parallel to the interfaces between the base portions 69b and the hard magnetic layers 70 (in the X direction). The hard magnetic layers 70 have a hexagonal close-packed structure, and the {100} faces of the structure are oriented parallel to the surface of the free magnetic layer F (in the X direction).

Hence, the c axes of the crystal axes of the hard magnetic layers 70 are oriented parallel to the surface of the first free magnetic layer 64, so that the bias magnetic field is generated effectively. Also, the coercive force of the hard magnetic layers 70 is increased, and therefore the Barkhausen noise of the thin-film magnetic element is lowered and the sensitivity of magnetic field detection is improved.

Figure 6:
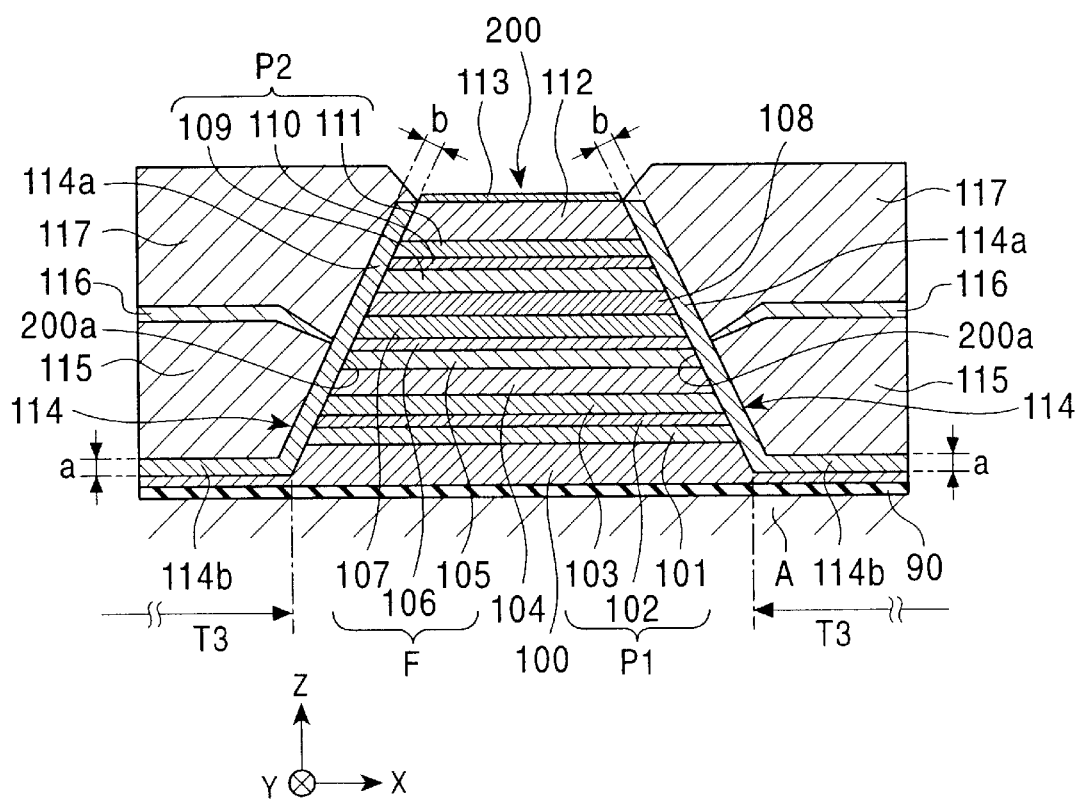
FIG. 6 is a sectional view of a thin-film magnetic element viewed from the ABS according to a sixth embodiment of the present invention.

FIG. 6 is a sectional view of a thin-film magnetic element viewed from the ABS according to a sixth embodiment of the present invention.

This thin film magnetic element is a so-called dual spin-valve thin-film magnetic element, provided, above and below a nonmagnetic material layer, first and second free magnetic layers 105 and 107, nonmagnetic conductive layers 104 and 108, first and third pinned magnetic layer 103 and 109, nonmagnetic material layers 102 and 110, second and fourth pinned magnetic layers 101 and 111, and antiferromagnetic layers 100 and 112. The dual spin-valve thin-film magnetic element exhibits a higher read output than the spin-valve thin film magnetic elements shown in FIGS. 1 to 5. Here, the undermost layer is an underlayer 90 deposited on a substrate A, and the uppermost layer is a protective layer 113. The layers from the underlayer 90 to the protective layer 113 constitute a multilayer film 200.

The antiferromagnetic layer 100 provided on the underlayer 90 extends toward both sides in the X direction, and protrudes in the center thereof.

The antiferromagnetic layers 100 and 112 are each formed of a Pt—Mn alloy film. Alternatively, the antiferromagnetic layers 100 and 112 are each formed of an X—Mn or a Pt—Mn—X' alloy, wherein X is at least one element selected from Pd, Ir, Rh, and Ru and X' is at least one element selected from Pd, Ir, Rh, Ru, Au, and Ag.

The first and the second free magnetic layers 105 and 107 and the first to the fourth pinned magnetic layers 103, 101, 109, and 111 are formed of a Ni—Fe alloy, elemental Co, an Fe—Co alloy, an Fe—Co—Ni alloy, or the like. The nonmagnetic conductive layers 104 and 108 are formed of a nonmagnetic conductive material having a low electrical resistance such as Cu.

Further, bias underlayers 114 formed of Cr are provided on both surfaces having a width T3 of the antiferromagnetic layer 100 and on both sides of the multilayer film 200 upwards, as shown FIG. 6. Thus the bias magnetic field generated from hard magnetic layers 115, which are described below, is increased. The bias underlayers 114 are alternatively formed of at least one nonmagnetic material selected from Cr, W, Mo, V, Mn, Nb, and Ta.

The bias underlayers 114 are provided with the hard magnetic layers 115 formed of a Co—Pt, a Co—Cr—Pt alloy, or the like thereon.

The hard magnetic layers 115 are provided with interlayers 116 formed of a nonmagnetic material such as Ta and electrode layers 50 formed of Cr, Au, Ta, W, or the like in that order.

Since the antiferromagnetic layer 100 shown in FIG. 6 underlies the hard magnetic layers 115, the thickness of the hard magnetic layers 115 can be reduced. The hard magnetic layers 115 therefore can be readily formed by sputtering.

In FIG. 6, having mutually different magnetic moments, the first and the second pinned magnetic layers 103 and 101 function as a pinned magnetic layer P1 including the nonmagnetic material layer 102. Also, having mutually different magnetic moments, the third and the fourth pinned magnetic layers 109 and 111 function a pinned magnetic layer P2 including the nonmagnetic material layer 110.

The first and the second pinned magnetic layers 103 and 101 are in a ferrimagnetic state, in which the magnetization directions thereof are different by 180° from each other. Each pinned magnetic layer pins the magnetization direction of the other, and thus the magnetization of the pinned magnetic layer P1 can be pinned in a certain direction.

The first and the second pinned magnetic layers 103 and 101 have different magnetic moments by being formed of the same material and by having different thicknesses.

Also, the third and the fourth pinned magnetic layers 109 and 111 are in a ferrimagnetic state, in which the magnetization directions thereof are different by 180° from each other, and each pinned magnetic layer pins the magnetization direction of the other.

The nonmagnetic material layers 102 and 110 are formed of at least one metal selected from Ru, Rh, Ir, Cr, Re, and Cu.

The second and the fourth pinned magnetic layers 101 and 111 are in contact with the antiferromagnetic layers 100 and 112, respectively. Exchange anisotropic magnetic fields based on magnetic coupling are generated at the interface between the second pinned magnetic layer 101 and the antiferromagnetic layer 100 and at the interface between the fourth pinned magnetic layer 111 and the antiferromagnetic layer 112 by annealing in a magnetic field.

The magnetization of the second pinned magnetic layer 101 is pinned in the Y direction in the drawing. When the magnetization of the second pinned magnetic layer 101 is pinned in the Y direction, the magnetization of the first pinned magnetic layer 103, which faces the second pinned magnetic layer 101 via the nonmagnetic material layer 102, is pinned antiparallel to the magnetization direction of the second pinned magnetic layer 101. The magnetization of the pinned magnetic layer P1 is oriented in the direction of the synthetic magnetic moment which is the sum of the magnetic moments of the first and the second pinned magnetic layers 103 and 101.

When the magnetization of the second pinned magnetic layer 101 is pinned in the Y direction, the magnetization of the fourth pinned magnetic layer 111 is preferably pinned antiparallel to the Y direction. In this case, the magnetization of the third pinned magnetic layer 109, which faces the fourth pinned magnetic layer 111 via the nonmagnetic material layer 110, is pinned antiparallel to the magnetization direction of the fourth pinned magnetic layer 111, or the Y direction. The magnetization of the pinned magnetic layer P2 is oriented in the direction of the synthetic magnetic moment which is the sum of the magnetic moments of the third and the fourth pinned magnetic layers 109 and 111.

Thus, the magnetization directions of the first and the third pinned magnetic layers 103 and 109, which is separated by the first free magnetic layer 105, the nonmagnetic material layer 106, and the second free magnetic layer 107, are antiparallel to, or different by 180° from each other.

The first and the second free magnetic layers 105 and 107 separated by the nonmagnetic material layer 106 constitute a free magnetic layer F and are in a ferrimagnetic state having an antiparallel magnetization arrangement.

Affected by an external magnetic field, the first and the second free magnetic layers 105 and 107 change the magnetization directions thereof while maintaining the ferrimagnetic state. At this moment, if the magnetization directions of the first and the third pinned magnetic layers 103 and 109 are antiparallel to, or different by 180° from each other, the rate of variations in resistance of the layers above the free magnetic layer F is equal to that of the layers below the free magnetic layer F.

Preferably, the magnetization direction of the pinned magnetic layer P1 is antiparallel to that of the pinned magnetic layer P2.

For example, the magnetic moment of the second pinned magnetic layer 101, of which the magnetization is pinned in the Y direction, is made larger than that of the first pinned magnetic layer 103 so that the magnetization of the pinned magnetic layer P1 is oriented in the Y direction. On the other hand, the magnetic moment of the third pinned magnetic layer 109, of which the magnetization is pinned in the Y direction, is made smaller than that of the fourth pinned magnetic layer 111 so that the magnetization of the pinned magnetic layer P2 is oriented in the opposite direction of the Y direction.

The magnetization directions of the pinned magnetic layer P1 and P2 are the same as the direction of a magnetic field generated by a sense current supplied in the X direction. Thus the ferrimagnetic states of the first and the second pinned magnetic layers 103 and 101 and of the third and the fourth pinned magnetic layers 109 and 111 become stable.

The first free magnetic layer 105 and the second free magnetic layer 107 have different magnetic moments by forming each free magnetic layer having a different thickness with the same material.

The nonmagnetic material layers 102, 106, and 110 are formed of at least one metal selected from Ru, Rh, Ir, Cr, Re, and Cu.

The first and the second free magnetic layers 105 and 107 are in a ferrimagnetic state, in which the magnetization directions thereof are different by 180° from each other. The ferrimagnetism brings about the same effect as that by decreasing the thickness of the free magnetic layer F, and thus the magnetic filed detection sensitivity of the magnetoresistive element is improved.

The magnetization of the free magnetic layer F is oriented in a direction of the synthetic magnetic moment which is the sum of the first and the second free magnetic layers 105 and 107.

The hard magnetic layers 115 are magnetized in the X direction (the track width direction), and the bias magnetic field from the hard magnetic layers 115 orients the magnetization of the free magnetic layer 24 in the X direction.

Each bias underlayer 114 has a sidewall portion 114a formed along a side surface 200a of the multilayer film 200 and a base portion 114b underlying a hard magnetic layer 115 substantially parallel to the surface of the substrate A in the track width direction (the X direction).

In this embodiment, the thickness b of the sidewall portion 114a is larger than the thickness a of the base portion 114b, that is, b/a>1.

Forming the sidewall portion 114a with a thickness b, which is larger than a, can result in the substantially uniform thickness of the sidewall portion 114a. Thus, the bias underlayers 114 can have a sufficient thickness near the free magnetic layer F. Thus, the coercive force and the remanence ratio of and the bias magnetic field from the hard magnetic layers 28 can be increased, and therefore Barkhausen noise of the thin-film magnetic element can be decreased.

The bias underlayers 114 are formed of Cr in this embodiment.

The thickness b of the sidewall portions 114a of the bias underlayers 114 is in the range of 15 to 75 Å. If the thickness b is less than 15 Å, the crystal orientation of the bias underlayers 114 is disordered near the surface thereof, and thus the hard magnetic layers 115 cannot have a proper crystal orientation on the sidewall portions 114a of the bias underlayers 114. As a result, the hard magnetic layers 115 cannot sufficiently generate a bias magnetic field on the sidewall portions 114a. If the thickness b of the sidewall portions 114a is more than 75 Å, the bias underlayers 114 block the bias magnetic field generated from the hard magnetic layers 115, and consequently the magnetization of the free magnetic layer is barely oriented.

In this embodiment, the base portions 114b of the bias underlayers 114 have a thickness a in the range of 15 to 50 Å, thus increasing the coercive force and the remanence ratio of the hard magnetic layers 115.

The bias underlayers 114 have a body-centered cubic structure, and the {200} faces of the structure are oriented parallel to the interfaces between the base portions 114b and the hard magnetic layers 115 (in the X direction). The hard magnetic layers 115 have a hexagonal close-packed structure, and the {100} faces of the structure are oriented parallel to the surface of the free magnetic layer F (in the X direction).

Hence, the c axes of the crystal axes of the hard magnetic layers 115 are oriented parallel to the surface of the free magnetic layer F, so that the bias magnetic field is generated effectively. Also, the coercive force and the remanence ratio of the hard magnetic layers 115 are increased. As a result, the Barkhausen noise of the thin-film magnetic element is lowered and the sensitivity of magnetic field detection is improved.

Figure 7:
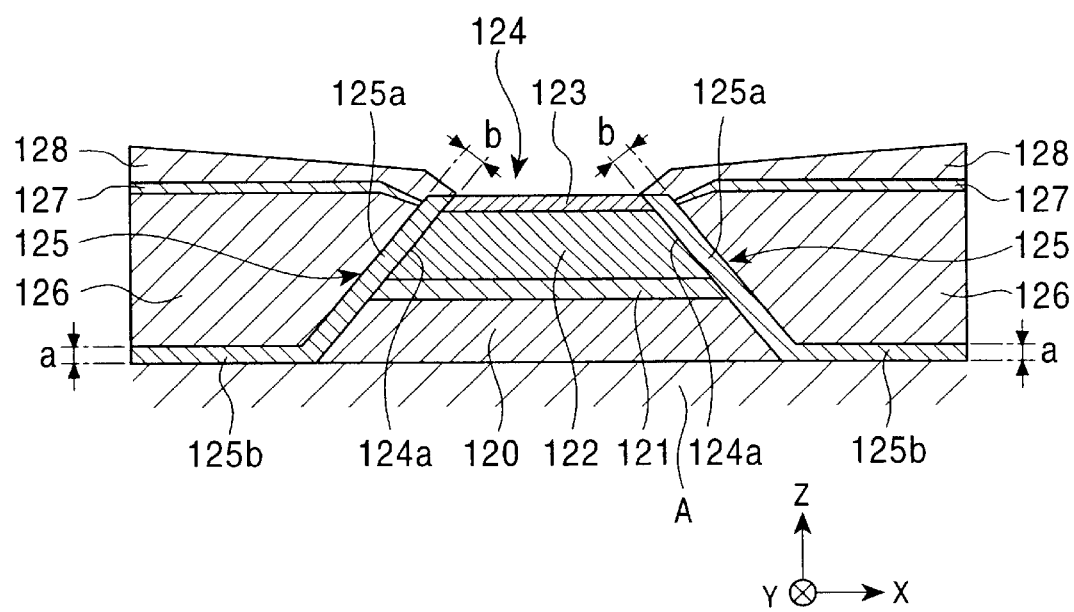
FIG. 7 is a sectional view of a thin-film magnetic element viewed from the ABS according to a seventh embodiment of the present invention.

FIG. 7 is a sectional view of a thin-film magnetic element viewed from the ABS according to a seventh embodiment of the present invention.

The magnetoresistive element shown in FIG. 7 is called an amisotropic magnetoresistive (AMR) element. A substrate A is provided with a multilayer film 124 formed by depositing a soft magnetic layer (SAL) 120, a nonmagnetic layer (SHUNT layer) 121, a magnetoresistive layer (MR layer) 120, and a protective layer 120 in that order.

The soft magnetic layer 120 is formed of a Ni—Fe—Nb alloy; the nonmagnetic layer 121 is formed of a Ta; and the magnetoresistive layer 122 is formed of a Ni—Fe alloy.

As shown in FIG. 7, both sides of the multilayer film 124 are provided with bias underlayers 125 formed of Cr. The bias underlayers 125 are alternatively formed of at least one nonmagnetic material selected from Cr, W, Mo, V, Mn, Nb, and Ta.

The bias underlayers 125 are each provided with a hard magnetic layer 126 formed of a Co—Pt alloy.

The hard magnetic layers 126 are magnetized in the X direction (the track width direction), and the bias magnetic field from the hard magnetic layers 126 orients the magnetization of the magnetoresistive layer 122 in the X direction.

Interlayers 127 are formed of a nonmagnetic material such as Ta on the hard magnetic layers 126, and electrode layers 128 are formed of Cr, Au, Ta, W, or the like on the interlayers 127.

Each bias underlayer 125 has a sidewall portion 125a formed along a side surface 124a of the multilayer film 124 and a base portion 125b underlying a hard magnetic layer 126 substantially parallel to the surface of the substrate A in the track width direction (the X direction).

In this embodiment, the thickness b of the sidewall portion 125a is larger than the thickness a of the base portion 125b, that is, b/a>1.

Forming the sidewall portion 125a with a thickness b, which is larger than a, can result in the substantially uniform thickness of the sidewall portion 125a. Thus, the bias underlayers 125 can have a sufficient thickness near the magnetoresistive layer 122. Thus, the coercive force and the remanence ratio of and the bias magnetic field from the hard magnetic layers 126 can be increased, and therefore Barkhausen noise of the thin-film magnetic element can be decreased.

The bias underlayers 125 are formed of Cr in this embodiment.

The thickness b of the sidewall portions 125a of the bias underlayers 125 is in the range of 15 to 75 Å. The base portions 125b of the bias underlayers 125 have a thickness a in the range of 15 to 50 Å, thus effectively increasing the coercive force and the remanence ratio of the hard magnetic layers 126.

The bias underlayers 125 have a body-centered cubic structure, and the {200} faces of the structure are oriented parallel to the interfaces between the base portions 125b and the hard magnetic layers 126 (in the X direction). The hard magnetic layers 126 have a hexagonal close-packed structure, and the {100} faces of the structure are oriented parallel to the surface of the magnetoresistive layer 122 (in the X direction).

Hence, the c axes of the crystal axes of the hard magnetic layers 126 are oriented parallel to the surface of the magnetoresistive layer 122, so that the bias magnetic field is generated effectively. Also, the coercive force of the hard magnetic layers 126 is increased, and therefore the Barkhausen noise of the thin-film magnetic element is lowered and the sensitivity of magnetic field detection is improved.

A manufacturing method of the thin-film magnetic elements will be described below.

Figure 8:
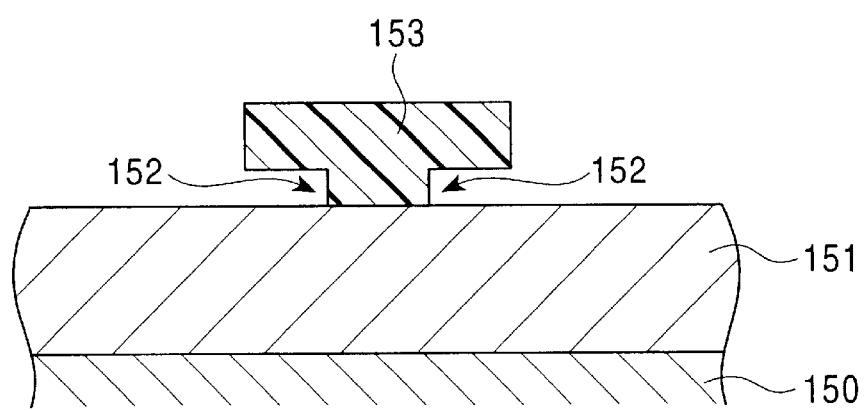
FIG. 8 is a process drawing of a thin-film magnetic element according to the present invention.

First, as shown in FIG. 8, a magnetoresistive multilayer film 151 is deposited on a substrate 150. The multilayer film 151 is provided with a lift-off resist layer 153 having a pair of incisions 152 which are provided at the bottom thereof.

The multilayer film 151 may be any one of the multilayer films of the single spin-valve thin-film elements shown in FIGS. 1 to 5, of the dual spin-valve thin-film element shown in FIG. 6, or of the AMR element shown in FIG. 7.

Figure 9:
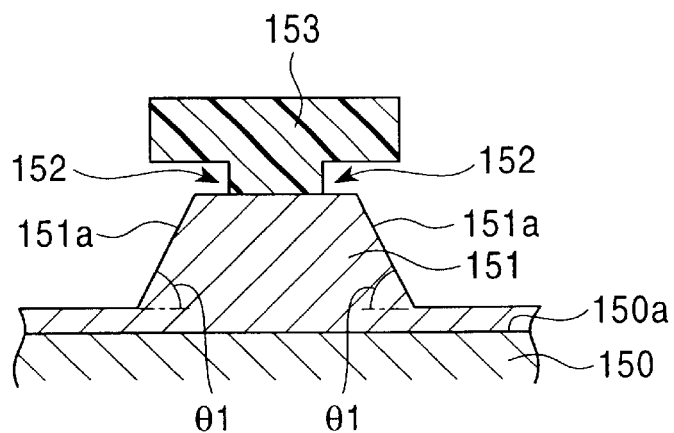
FIG. 9 is a process drawing of the thin-film magnetic element according to the present invention.

Next, as shown in FIG. 9, the multilayer film 151 is removed, by ion milling particles, other than the portion thereof which is covered with the lift-off resist layer 153 to be formed into substantially a trapezoid. Here, the angle between each side surface 151a of the multilayer film 151 and the surface 150a of the substrate 150 is θ1.

In order to form antiferromagnetic layers 41, 61, or 100 so as to extend in the X direction as shown in FIG. 3, 4, 5, or 6, etching for the multilayer film 151 may be controlled in rate and time so that both sides of the antiferromagnetic layer 41, 61, or 100 slightly remain.

If the multilayer film 151 is formed as a multilayer film of a single or a dual spin-valve thin-film element, the antiferromagnetic layer included in the multilayer film 151 is preferably formed of a Pt—Mn alloy. Alternatively, the antiferromagnetic layer may be formed of an X—Mn or a Pt—Mn—X', wherein X is at least one element selected from Pd, Ir, Rh, and Ru and X' is at least one element selected from Pd, Ir, Rh, Ru, Au, and Ag. When the antiferromagnetic layer is formed of such a material, heat treatment is required in order to generate an exchange coupling magnetic field at the interface between the antiferromagnetic layer and the pinned magnetic layer.

Figure 10:
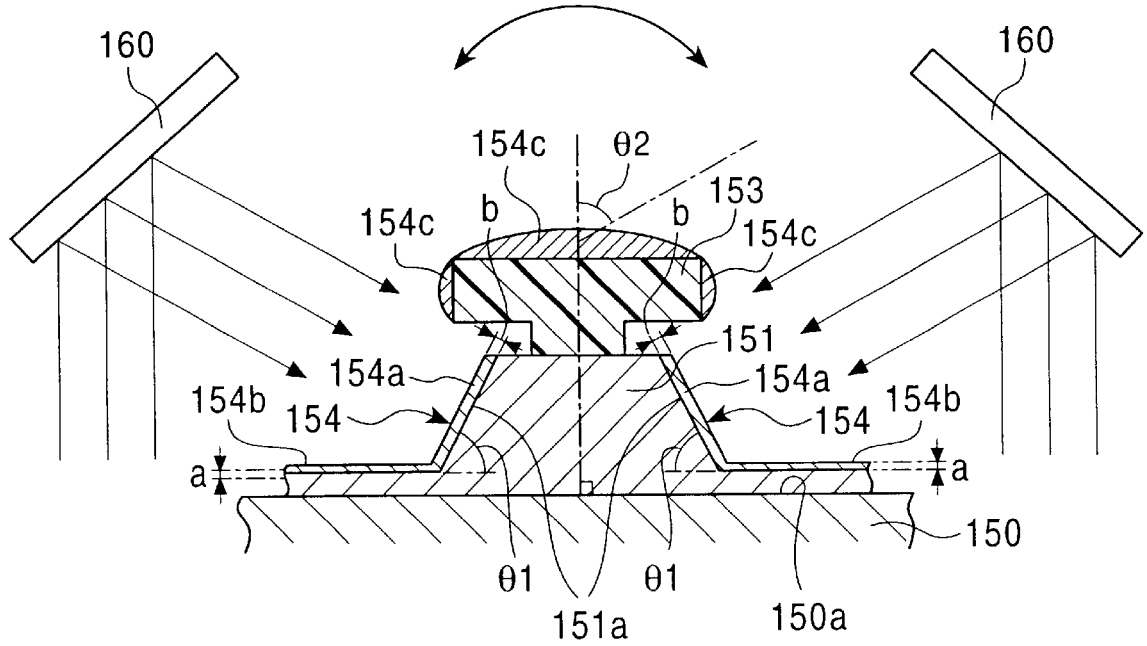
FIG. 10 is a process drawing of the thin-film magnetic element according to the present invention.
Figure 11:
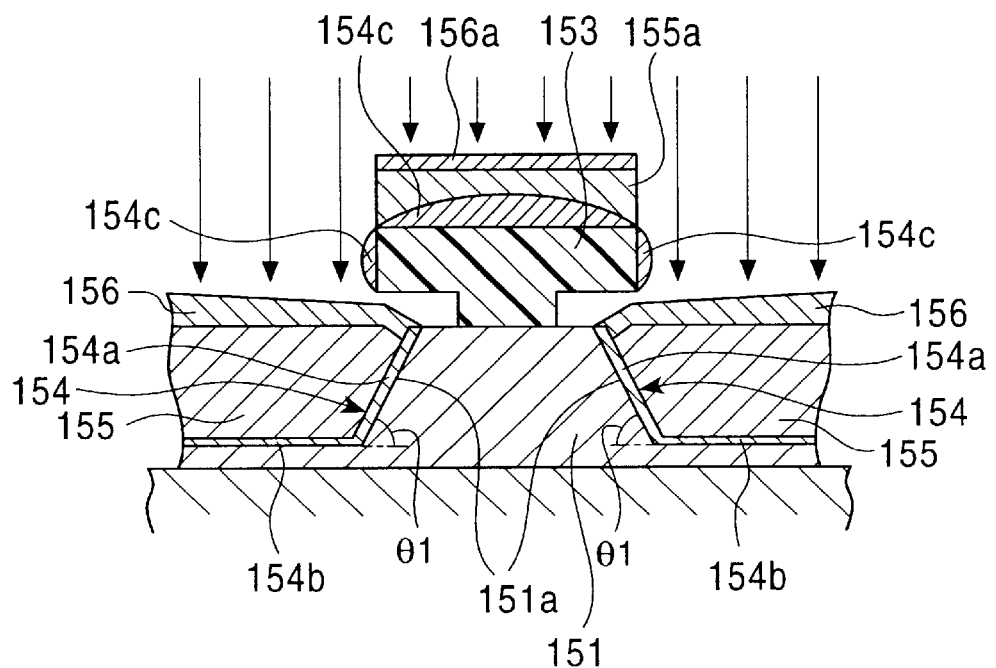
FIG. 11 is a process drawing of the thin-film magnetic element according to the present invention.

Next, as shown in FIG. 10, bias underlayers 154 are deposited on both sides of the multilayer film 151, by ion-beam sputtering, long-throw sputtering, or collimation sputtering, at a predetermined angle of $\theta 2$ with respect to the normal to the surface 150$a$ of the substrate 150 by means of chromium targets.

For example, the chromium targets 160 are inclined with respect to the substrate 150 provided with the multilayer film 151, and ion-beam sputtering is applied to the multilayer film 151 to deposit the bias underlayer 154 with the inclined chromium targets 160 moved above the substrate 150.

In FIG. 10, the substrate 150 is fixed and the targets 160 are moved at an oblique dangle with respect to the substrate 150; however, the targets 160 may be fixed and the substrate is moved at an oblique angle with respect to the targets 160. The resist layer 153 is provided with a layer 154$c$ formed of the same material as the bias underlayers 154 on the upper surface and both sides thereof as shown in FIG. 10.

The bias underlayers 154 may be formed by means of the targets composed of at least one nonmagnetic material selected from Cr, W, Mo, V, Mn, Nb, and Ta.

In this case, the thickness b of the sidewall portions 154$a$ of the bias underlayers 154, which are formed along both side surfaces of the multilayer film 151, is larger than the thickness a of the base portions 154$b$, which extend substantially parallel to the surface of the substrate 150 in the track width direction (the X direction).

Next, hard magnetic layers 155 are deposited on the bias underlayers 154, or at both sides of the multilayer film 151 in the track width direction, by means of a target composed of a Co—Pt alloy. The hard magnetic layers 155 are provided with electrode layers 156 by means of a target composed of Cu or the like thereon. The resist layer 153 is provided with layers 155$a$ and 156$a$ thereon. The layers 155$a$ and 156$a$ are composed of the same materials as the hard magnetic layers 155 and the electrode layers 156 respectively.

In order to form the hard magnetic layers 155 and the electrode layers 156, ion-beam sputtering, long-throw sputtering, or collimation sputtering is applied.

Figure 12:
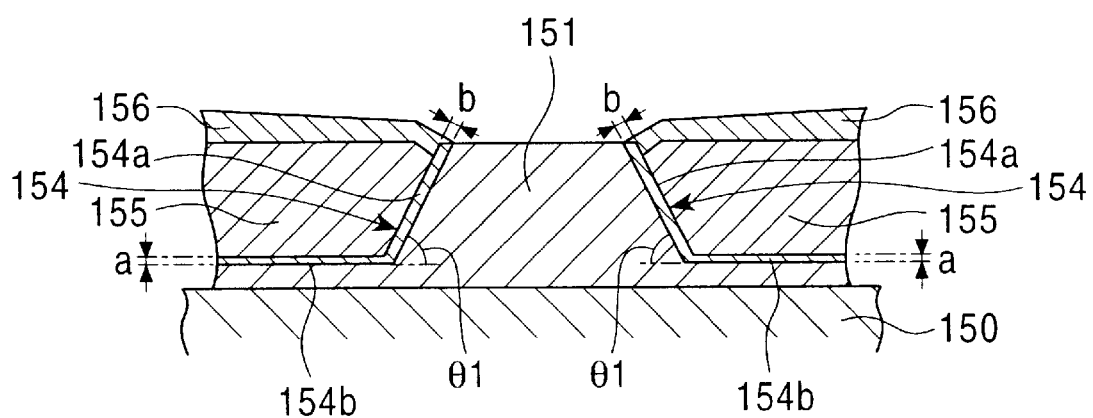
FIG. 12 is a process drawing of the thin-film magnetic element according to the present invention.

Finally, the resist layer 153 is removed to obtain the thin-film magnetic element as shown in FIG. 12, and then the hard magnetic layers 155 are magnetized in the track width direction.

In this embodiment, by forming the bias underlayers 154 on both sides of the multilayer film 151 at a predetermined angle of $\theta 2$ with respect to the normal to the surface 150$a$ of the substrate 150, the sidewall portions 154$a$ formed along both sides of the multilayer film 151 can have a thickness b larger than the thickness a of the base portions 154$b$ formed substantially parallel to the surface 150$a$ of the substrate 150.

Forming the sidewall portions 154$a$ with a thickness b, which is larger than a, can result in the sidewall portions 154$a$ having a substantially uniform thickness. The bias underlayers 154 are formed with a sufficient thickness near at least one magnetic layer included in the multilayer film 151 (or a free magnetic layer when the multilayer film 151 results in a single or a dual spin-valve thin-film element). Thus, the coercive force and the remanence ratio of the hard magnetic layers 155 and a bias magnetic field can be increased, and therefore Barkhausen noise of the thin-film magnetic element can be decreased.

Forming the multilayer film 151 so that the angle $\theta 1$ between the surface 150$a$ of the substrate 150 and both side surfaces 151$a$ of the multilayer film 151 are in the range of 20 to 60° and applying sputtering particles at an incident angle $\theta 2$ in the range of 30 to 60° with respect to the normal to the surface 150$a$ of the substrate 150 allow the bias underlayers 154 to be readily formed with a thickness b of the sidewall portions 154$a$ larger than the thickness a of the base portions 154$b$.

Alternatively, the multilayer film 151 is formed so that the angle $\theta 1$ between the surface 150$a$ of the substrate 150 and both side surfaces 151$a$ of the multilayer film 151 are in the range of 20 to 45°, and the bias underlayers 154$b$ are formed by applying sputtering particles at an incident angle $\theta 2$ in the range of 19 to 60° with respect to the normal to the surface 150$a$ of the substrate 150. The angle $\theta 1$ may be in the range of 20 to 30° and concurrently the angle $\theta 2$ is in the range of 15 to 60°, in order that the bias underlayers 154 can be readily formed with the thickness b of the sidewall portions larger than the thickness a of the base portions 154$b$.

Preferably, the thickness b of the sidewall portions 154$a$ of the bias underlayers 154 is in the range of 15 to 75 Å, and the thickness a of the base portions 154$b$ is in the range of 15 to 50 Å.

By applying sputtering particles at an incident angle $\theta 2$ of 50° or more, the bias underlayers 154 can have a body-centered cubic structure, and the {200} faces of the structure thereof are oriented parallel to the interfaces between the base portions 154$b$ and the hard magnetic layers 155.

When the bias underlayers 154 have a body-centered cubic structure, and the {200} faces of the structure thereof are oriented parallel to the interfaces between the base portions 154$b$ and the hard magnetic layers 155, the hard magnetic layers 155 can have a hexagonal close-packed structure such that the {100} faces are oriented parallel to the surface of the magnetic layer of which the magnetization is oriented by a bias magnetic field from the hard magnetic layers 155 (in the X direction).

When the multilayer film 151 results in a spin-valve thin-film magnetic element, the thickness b of the sidewall portions 154$a$ on both sides of at least the free magnetic layer in the track width direction is required to be larger than the thickness a of the base portions 154$b$.

Also, when a magnetic head comprises any thin-film magnetic element shown in FIGS. 1 to 7 and 12, an underlayer formed of an insulating material such as alumina, a lower shielding layer formed of a magnetic alloy, and a lower gap layer formed of an insulating material are deposited in that order between the substrate and the thin-film magnetic element. Hence, the thin-film magnetic element is deposited on the lower gap layer. The thin-film magnetic element is further provided with an upper gap layer formed of an insulating material and an upper shielding layer formed of a magnetic alloy in that order. The upper shielding layer may be provided with an inductive element for writing.

EXAMPLE

Figure 13:
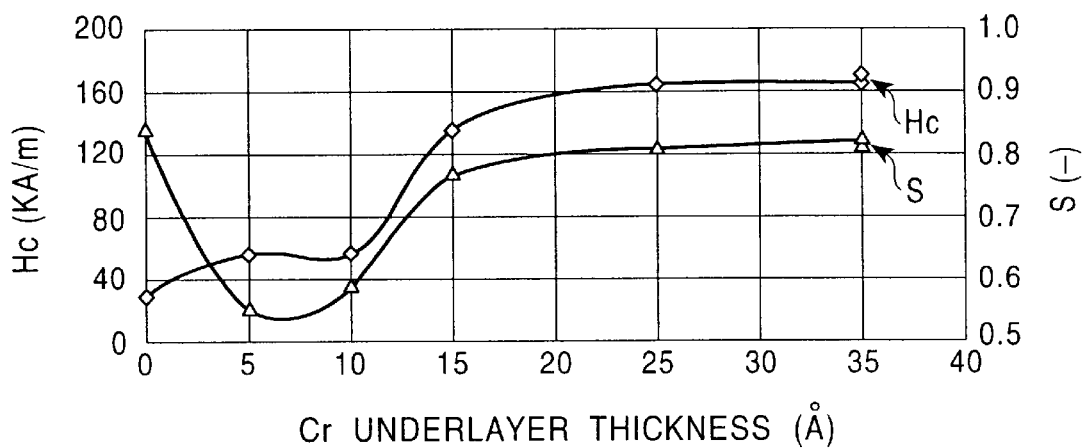
FIG. 13 is a graphic representation showing the relationship between the thickness of bias underlayers and the coercive force and remanence ration of hard magnetic layers of a spin-valve thin-film magnetic element.

FIG. 13 is a graph showing the measurement results of the coercive force Hc and the remanence ratio S of the hard magnetic layers 28 when the thickness a of the base portions 27b of the bias underlayers 27 is varied in the spin-valve thin-film magnetic element shown in FIG. 1.

The bias underlayers 27 of the tested spin-valve thin-film magnetic element were formed of Cr. The hard magnetic layers 28 were formed of a Co—Pt alloy, having a thickness of 270 Å.

The tested spin-valve thin-film magnetic element was produced by the manufacturing method described in FIGS. 8 to 12. In forming the bias underlayers 27, sputtering particles were applied at an incident angle of 50° (corresponding to θ2 in FIG. 10) with respect to the normal to the surface A1 of the substrate A.

Referring to FIG. 13, when the thickness a of the base portions 27b of the bias underlayers 27 became 15 Å or more, the coercive force Hc and the remanence ratio S rapidly increased. The reason is that the crystal orientation at the interfaces between the bias underlayers 27 and the hard magnetic layers 28 becomes stable when the thickness a of the base portions 27b becomes 15 Å or more.

Figure 14:
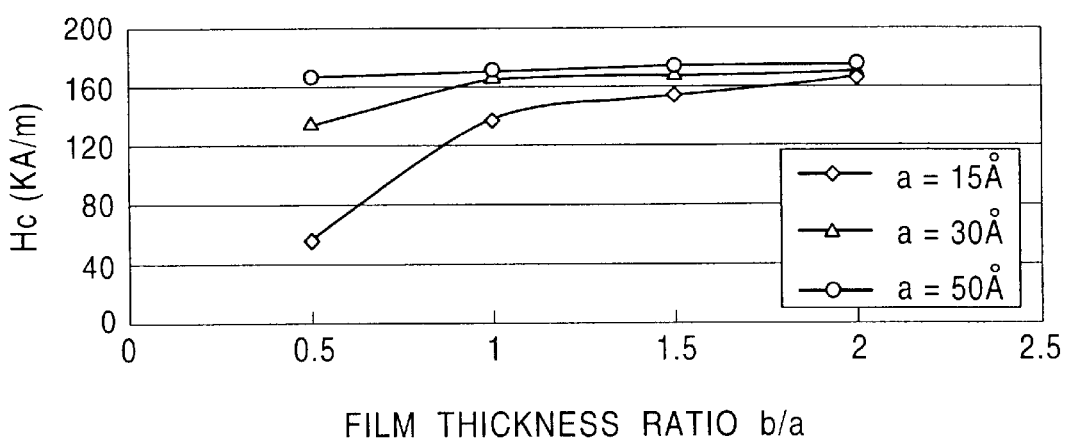
FIG. 14 is a graphic representation showing the relationship between the thickness ratio of the sidewall portions and the base portion included in the bias underlayers and the coercive force of hard magnetic layers.
Figure 15:
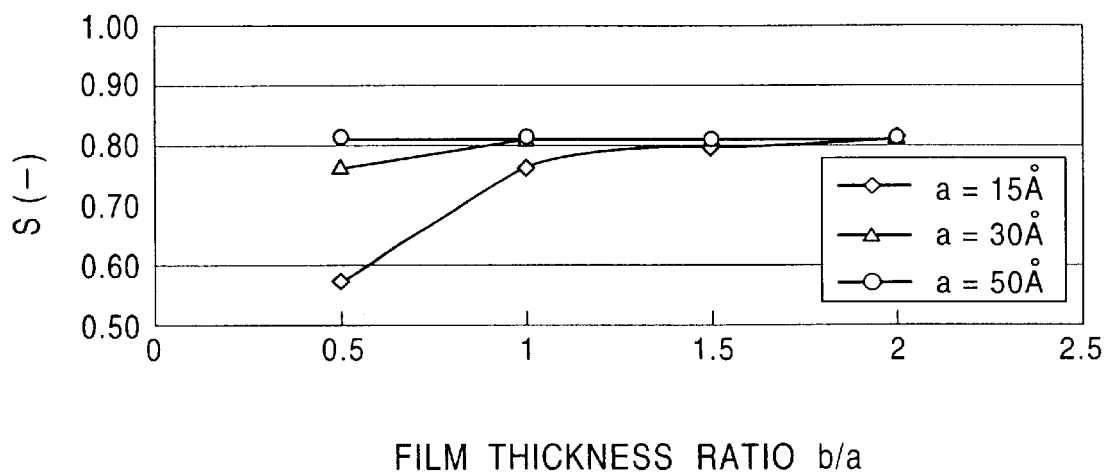
FIG. 15 is a graphic representation showing the relationship between the thickness ratio of the sidewall portions and the base portions included in the bias underlayers and the remanence ratio of the hard magnetic layers.

FIG. 14 is a graph showing the measurement results of the coercive force Hc of the hard magnetic layers 28 when the bias underlayers were formed with a fixed thickness a of the base portions 27b and varying thicknesses b of sidewall portions 27a to vary the thickness ratio b/a in the spin-valve thin-film magnetic element shown in FIG. 1. FIG. 15 is a graph showing the measurement results of the remanence ratio S in the same manner. In the measurement of the coercive force Hc and the remanence ratio S, the thickness a of the base portions 27b was 15, 30, or 50 Å and the thickness b of the sidewall portions 27a is varied for each thickness a.

Referring to FIGS. 14 and 15, when the thickness ratio b/a became more than 1.0, the coercive force Hc of the hard magnetic layers 28 became more than 136 A/m (1700 Oe) and the remanence ratio S became more than 0.78. Furthermore, when the thickness ratio b/a became more than 1.0, the coercive force Hc and the remanence ratio S of the hard magnetic layers 28 varied less. Hence, a thickness ratio b/a of more than 1.0 allows the coercive force Hc and the remanence ratio S to be stable even if the bias underlayers have variations in the thickness ratio b/a.

According to FIGS. 14 and 15, it is advantageous that the bias underlayers 27 are formed with a thickness a of 15 or 30 Å and a thickness ratio b/a of more than 1.0. Therefore the preferable thickness a of the base portions in this embodiment was determined to be in the range of 15 to 50 Å.

The determination that the preferable thickness a and the thickness ratio b/a are 15 Å or more and more than 1.0 respectively led the preferable thickness b of the sidewall portions 27a to be 15 Å or more. The thickness b of the sidewall portions 27a was specified within a certain value by which the sidewall portions 27a of the bias underlayers 27 did not prevent the hard magnetic layers 28 from generating a bias magnetic field, and preferably 75 Å or less.

Figure 16:
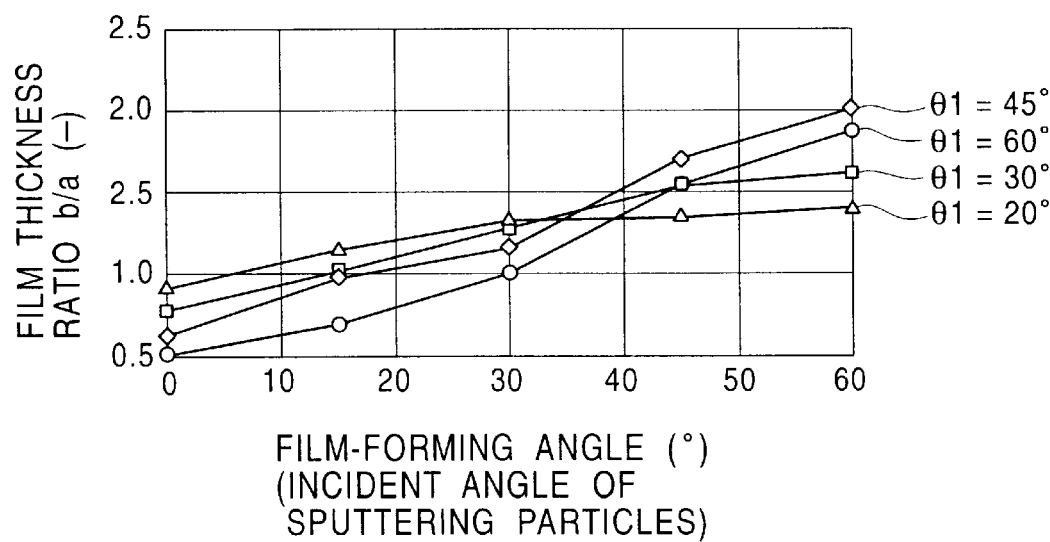
FIG. 16 is a graphic representation showing the relationship between the angle for forming the bias underlayers and the thickness ratio of the sidewall portions and the base portions.

FIG. 16 is a graph showing the measurement results of the thickness ratio b/a when the bias underlayers 27 shown in FIG. 10 were formed by applying sputtering particles at a varied angle θ2 in the manufacturing method of the thin-film magnetic element described above referring to FIGS. 8 to 12.

The measurement was performed at the angle θ1 between the surface 150a of the substrate 150 and both sides 151a of the multilayer film 151. The angle θ1 was 20°, 30°, 45°, and 60°.

According to FIG. 16, when the angle θ1 between the surface 150a of the substrate 150 and both sides 151a of the multilayer film 150 is in the range of 20 to 60° and the bias underlayers 154 are formed by applying sputtering particles at an incident angle θ2 in the range of 30 to 60° with respect to the normal to the surface 150a of the substrate 150, the sidewall portions 154a can be formed with a thickness b larger than the thickness a of the base portions 154b (b/a>1).

When the angle θ1 between the surface 150a of the substrate 150 and both sides 151a of the multilayer film 151 is in the range of 20 to 45° and the bias underlayers 154 are formed by applying sputtering particles at an incident angle θ2 in the range of 19 to 60° with respect to the normal to the surface 150a of the substrate 150, the sidewall portions 154a can be formed with a thickness b larger than the thickness a of the base portions 154b.

Also, when the angle θ1 between the surface 150a of the substrate 150 and both sides 151a of the multilayer film 151 is in the range of 20 to 30° and the bias underlayers 154 are formed by applying sputtering particles at an incident angle θ2 in the range of 15 to 60° with respect to the normal to the surface 150a of the substrate 150, the sidewall portions 154a can be formed with a thickness b larger than the thickness a of the base portions 154b.

Also, when the angle θ1 between the surface 150a of the substrate 150 and both sides 151a of the multilayer film 151 is 20° and the bias underlayers 154 are formed by applying sputtering particles at an incident angle θ2 of 8° or more with respect to the normal to the surface 150a of the substrate 150, the sidewall portions 154a can be formed with a thickness b larger than the thickness a of the base portions 154b.

Figure 17:
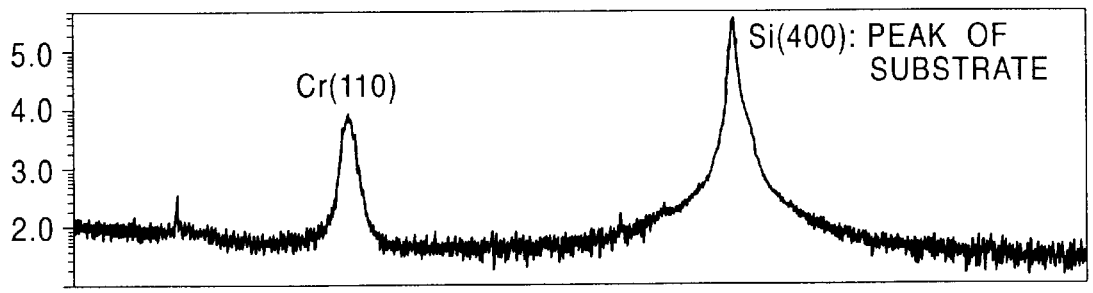
FIG. 17 is a graphic representation showing a result of an X-ray diffraction analysis for a chromium single-layer film.
Figure 18:
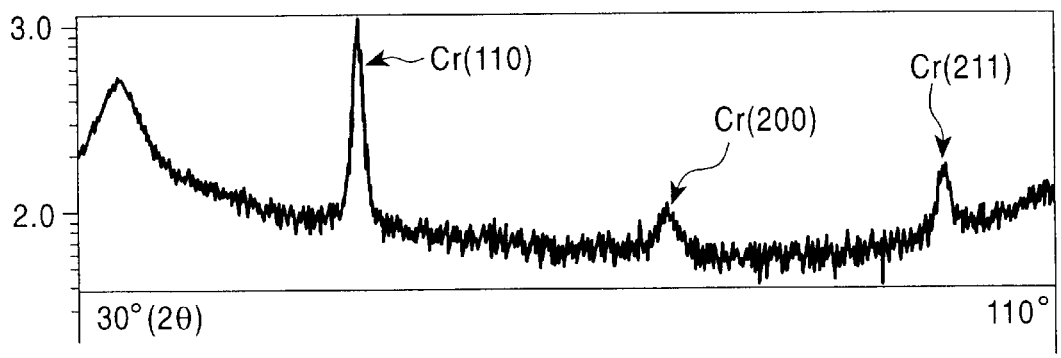
FIG. 18 is a graphic representation showing a result of an X-ray diffraction analysis for a chromium single-layer film.

FIGS. 17 and 18 are graphs showing crystal faces of a chromium single-layer film deposited on a silicon substrate by ion-beam sputtering, shown by an X-ray diffraction analysis.

FIG. 17 shows crystal faces of the chromium single-layer film deposited by applying sputtering particles at an incident angle of 20° with respect to the normal to the silicon substrate. FIG. 18 shows crystal faces of the chromium single-layer film deposited by applying sputtering particles at an incident angle of 50° with respect to the normal.

Referring to FIG. 17, when the chromium film was formed by applying sputtering particles at the incident angle of 20°, only the {110} faces of the crystal oriented the surface of the chromium film. On the other hand, when the chromium film was formed at an incident angle of 50°, the {200} faces of the crystal oriented the surface of the chromium film as well. The chromium film has a body-centered cubic structure.

Figure 19:
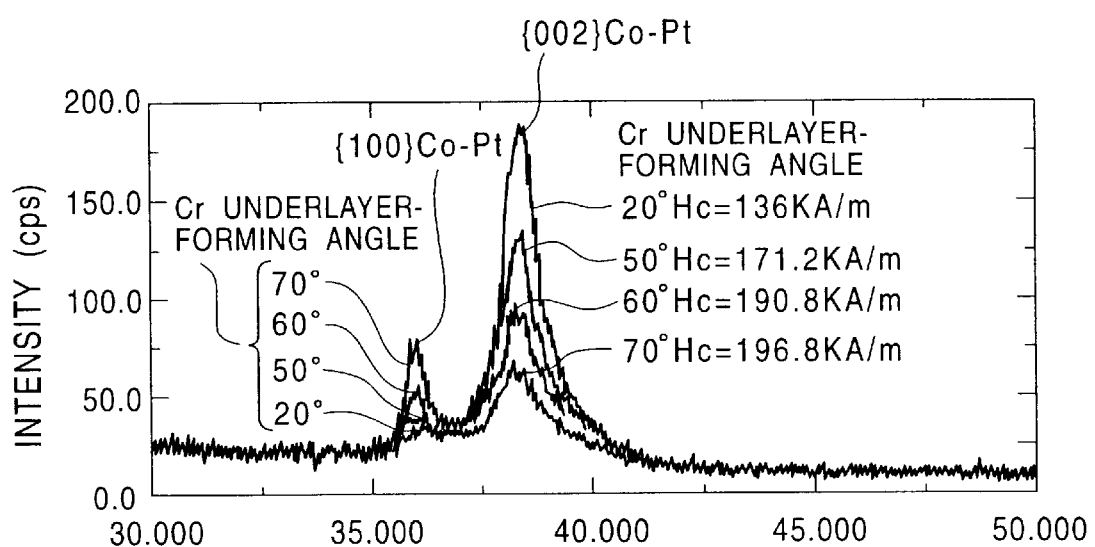
FIG. 19 is graphic representation showing a result of an X-ray diffraction analysis for a Cr/Cr—Pt laminate.
Figure 20:
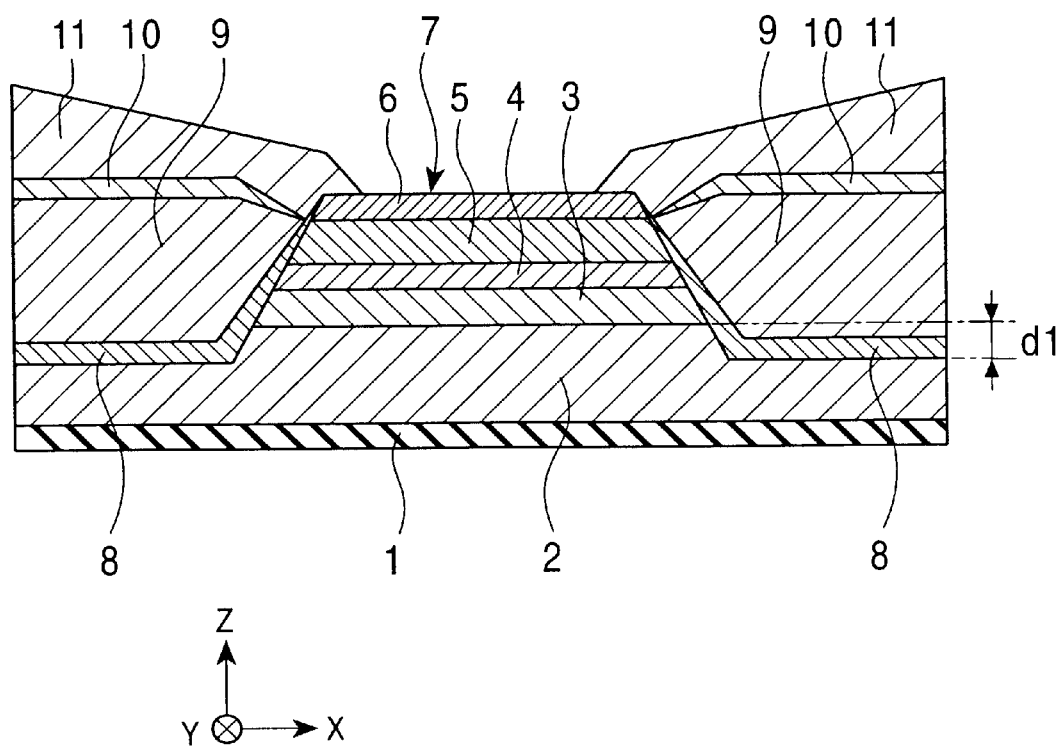
FIG. 20 is a sectional view of a conventional thin-film magnetic element viewed from the ABS.

FIG. 19 is a graph showing crystal faces of a Co—Pt layer of a two-layer film composed of a chromium layer and a Co—Pt layer by ion-beam sputtering, shown by an X-ray diffraction analysis.

Each chromium layer of the specimens was deposited by applying sputtering particles at a varied incident angle between 20° and 70° with respect to the normal to the silicon substrate.

According to FIG. 19, the larger the incident angle for forming the chromium layer is, the smaller the peak representing the {002} faces of the Co—Pt layer orienting the surface thereof is, and the larger the peak representing the {100} faces of the same is. The peak representing the {100} faces is observed only when the incident angle for forming the chromium layer is 50° or more and is not observed when the angle was 20°. The chromium layer had a body-centered cubic structure and the Co—Pt layer had a hexagonal close-packed structure.

The smaller the peak representing the {002} faces of the Co—Pt layer is and the larger the {100} faces are, the more the coercive force of the Co—Pt layer is increased.

The results according to FIGS. 17, 18, and 19 lead to the following conclusions.

Forming the chromium layer at an incident angle of 50° or more allows the {200} faces of the chromium layer crystal to be oriented to the surface thereof. The {200} faces oriented to the surface thereof allow the {100} faces of the Co—Pt layer crystal, which is deposited on the chromium layer, to be oriented to the surface of the Co—Pt layer. Thus the coercive force of the Co—Pt layer is increased. Forming the chromium layer at an incident angle of more than 50° increases the number of {200} faces oriented to the chromium layer surface, and increases the number of {100} faces of the Co—Pt layer crystal oriented to the Co—Pt layer surface. Thus the coercive force of the Co—Pt layer is increased.

What is claimed is:

1. A thin-film magnetic element comprising:

a substrate;

a magnetoresistive multilayer film including at least one magnetic layer, provided on said substrate;

bias underlayers formed of a nonmagnetic material, having sidewall portions formed along side surfaces of said multilayer film and base portions formed on the surface of said substrate in the track width direction, wherein the thickness of the sidewall portions is larger than that of the base portions; and hard magnetic layers deposited on said bias underlayers at both sides of said multilayer film, said hard magnetic layers orienting the magnetization direction of said at least one magnetic layer, wherein the base portions have a thickness in the range of 15 to 50 Å.

2. A thin-film magnetic element according to claim 1, wherein said bias underlayers comprise at least one nonmagnetic material selected from the group consisting of Cr, W, Mo, V, Nb, and Ta.

3. A thin-film magnetic element according to claim 1, wherein the sidewall portions of said bias underlayers have a thickness in the range of 15 to 75 Å.

4. A thin-film magnetic element according to claim 1, wherein said bias underlayers have a body-centered cubic crystal structure of which the {200} faces are oriented parallel to the interfaces between the base portions thereof and said hard magnetic layers.

5. A thin-film magnetic element according to claim 1, wherein said multilayer film comprises an antiferromagnetic layer, a pinned magnetic layer of which the magnetization direction is pinned by the antiferromagnetic layer, a nonmagnetic conductive layer, and a free magnetic layer of which the magnetization direction is changed by an external magnetic field, and said hard magnetic layers are provided at both sides of the free magnetic layer in the track width direction, whereby the magnetization of the free magnetic layer is oriented in the direction which intersects the magnetization direction of the pinned magnetic layer by magnetic coupling with hard magnetic layers.

6. A thin-film magnetic element according to claim 5, wherein, at least at both sides of the free magnetic layer in the track width direction, the sidewall portions have a thickness larger than that of the base portions.

7. A thin-film magnetic element according to claim 1, wherein the base portions have a thickness in the range of 15 to 50 Å.

8. A thin-film magnetic element comprising:

a substrate;

a magnetoresistive multilayer film including at least one magnetic layer, provided on said substrate;

bias underlayers formed of a nonmagnetic material, having sidewall portions formed along side surfaces of said multilayer film and base portions formed on the surface of said substrate in the track width direction, wherein the thickness of the sidewall portions is larger than that of the base portions; and hard magnetic layers deposited on said bias underlayers at both sides of said multilayer film, said hard magnetic layers orienting the magnetization direction of said at least one magnetic layer, wherein said bias underlayers have a body-centered cubic crystal structure of which the {200} faces are oriented parallel to the interfaces between the base portions thereof and said hard magnetic layers.

9. A thin-film magnetic element according to claim 8, wherein said bias underlayers comprise at least one nonmagnetic material selected from the group consisting of Cr, W, Mo, V, Nb, and Ta.

10. A thin-film magnetic element according to claim 8, wherein the sidewall portions of said bias underlayers have a thickness in the range of 15 to 75 Å.

11. A thin-film magnetic element according to claim 8, wherein said hard magnetic layers have a hexagonal close-packed crystal structure of which the {100} faces are oriented parallel to the surface of the magnetic layer of which the magnetization direction is oriented by a bias magnetic field from said hard magnetic layers.

12. A thin-film magnetic element according to claim 8, wherein said multilayer film comprises an antiferromagnetic layer, a pinned magnetic layer of which the magnetization direction is pinned by the antiferromagnetic layer, a nonmagnetic conductive layer, and a free magnetic layer of which the magnetization direction is changed by an external magnetic field, and said hard magnetic layers are provided at both sides of the free magnetic layer in the track width direction, whereby the magnetization of the free magnetic layer is oriented in the direction which intersects the magnetization direction of the pinned magnetic layer by magnetic coupling with hard magnetic layers.

13. A thin-film magnetic element according to claim 12, wherein, at least at both sides of the free magnetic layer in the track width direction, the sidewall portions have a thickness larger than that of the base portions.

14. A thin-film magnetic element according to claim 8, wherein the base portions have a thickness in the range of 15 to 50 Å.

* * * * *

UNITED STATES PATENT AND TRADEMARK OFFICE
CERTIFICATE OF CORRECTION

PATENT NO. : 6,667,493 B2
DATED : December 23, 2003
INVENTOR(S) : Masahiro Ooshima It is certified that error appears in the above-identified patent and that said Letters Patent is hereby corrected as shown below:

<u>Column 23,</u>
Lines 15-16, delete "wherein the base portions have a thickness in the range of 15 to 50 Å." and substitute -- wherein said hard magnetic layers have a hexagonal close-packed crystal structure of which the {100} faces are oriented parallel to the surface of the magnetic layer of which the magnetization direction is oriented by bias magnetic field from said hard magnetic layers. --.

Signed and Sealed this

Seventh Day of September, 2004

JON W. DUDAS
*Director of the United States Patent and Trademark Office*